(12) United States Patent
Mascolo et al.

(10) Patent No.: US 8,358,010 B2
(45) Date of Patent: Jan. 22, 2013

(54) METHOD FOR REALIZING A NANOMETRIC CIRCUIT ARCHITECTURE BETWEEN STANDARD ELECTRONIC COMPONENTS AND SEMICONDUCTOR DEVICE OBTAINED WITH SAID METHOD

(75) Inventors: Danilo Mascolo, Ercolano (IT); Gianfranco Cerofolini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1163 days.

(21) Appl. No.: 11/817,318

(22) PCT Filed: Feb. 28, 2005

(86) PCT No.: PCT/IT2005/000110
§ 371 (c)(1),
(2), (4) Date: May 19, 2008

(87) PCT Pub. No.: WO2006/090417
PCT Pub. Date: Aug. 31, 2006

(65) Prior Publication Data
US 2008/0246158 A1    Oct. 9, 2008

(51) Int. Cl.
*H01L 23/528* (2006.01)
(52) U.S. Cl. ........ 257/773; 438/694; 438/696; 438/700; 438/703; 438/734; 438/736; 438/942; 438/946; 438/947; 216/36; 216/46; 216/47; 257/E21.233; 257/E21.234; 257/E21.235; 257/E21.236; 977/712; 977/720; 977/722; 977/723; 977/888
(58) Field of Classification Search .......... 438/689–691, 438/694, 696, 700, 702–703, 942, 946–947, 438/734, 736; 257/E21.232, E21.233, E21.234, 257/E21.235, E21.236; 216/8, 11, 13, 15, 216/39, 41, 72, 74, 79, 83, 96, 99, 46, 47; 264/293, 320; 977/712, 720–723, 887–888, 890–893
See application file for complete search history.

(56) References Cited

U.S. PATENT DOCUMENTS
5,013,397 A * 5/1991 Tsukakoshi ............... 216/20
5,688,723 A  11/1997 Okamoto et al.
(Continued)

FOREIGN PATENT DOCUMENTS
EP        1333324 A2   8/2003
EP        1 357 433 A2  10/2003

OTHER PUBLICATIONS

Austin, M. et al., 6 nm half-pitch lines and 0.04 µm2 static random access memory patterns by nanoimprint lithography, Nanotechnology (16):1058-1061, 2005.
(Continued)

*Primary Examiner* — Matthew Reames
*Assistant Examiner* — Ermias Woldegeorgis
(74) *Attorney, Agent, or Firm* — Seed IP Law Group PLLC

(57) ABSTRACT

A method for realizing a nanometric circuit architecture includes: realizing plural active areas on a semiconductor substrate; realizing on the substrate a seed layer of a first material; realizing a mask-spacer of a second material on the seed layer in a region comprised between the active areas; realizing a mask overlapping the mask-spacer and extending in a substantially perpendicular direction thereto; selectively removing the seed layer exposed on the substrate; selectively removing the mask and the mask-spacer obtaining a seed-spacer comprising a linear portion extending in that region and a portion substantially orthogonal thereto; realizing by MSPT from the seed-spacer an insulating spacer reproducing at least part of the profile of the seed-spacer; realizing by MSPT a nano-wire of conductive material from the seed-spacer or insulating spacer, the nano-wire comprising a first portion at least partially extending in the region and a second portion contacting a respective active area.

15 Claims, 43 Drawing Sheets

U.S. PATENT DOCUMENTS

| | | | |
|---|---|---|---|
| 5,916,821 A | 6/1999 | Kerber | |
| 6,128,214 A | 10/2000 | Kuekes et al. | |
| 6,743,368 B2 | 6/2004 | Lee | |
| 6,872,647 B1 | 3/2005 | Yu et al. | |
| 7,256,131 B2 | 8/2007 | LaBrake | |
| 7,368,395 B2 | 5/2008 | Islam et al. | |
| 7,432,120 B2 | 10/2008 | Mascolo et al. | |
| 7,449,348 B1 | 11/2008 | Dakshina-Murthy et al. | |
| 7,456,508 B2 | 11/2008 | Mascolo et al. | |
| 7,462,292 B2 | 12/2008 | Lee | |
| 7,492,624 B2 | 2/2009 | Mascolo et al. | |
| 7,579,278 B2 | 8/2009 | Sandhu | |
| 7,605,066 B2 | 10/2009 | Cerofolini et al. | |
| 2002/0163079 A1* | 11/2002 | Awano | 257/750 |
| 2003/0003775 A1 | 1/2003 | Chen | |
| 2003/0108728 A1* | 6/2003 | Heath et al. | 428/209 |
| 2003/0141276 A1 | 7/2003 | Lee | |
| 2003/0205658 A1 | 11/2003 | Voisin | |
| 2004/0155011 A1 | 8/2004 | Hareland et al. | |
| 2005/0189676 A1* | 9/2005 | Sreenivasan | 264/225 |
| 2007/0065990 A1 | 3/2007 | Degroote et al. | |
| 2007/0148975 A1 | 6/2007 | Mascolo et al. | |
| 2008/0286449 A1 | 11/2008 | Park | |
| 2009/0310256 A1 | 12/2009 | Albrecht et al. | |

OTHER PUBLICATIONS

Cerofolini, G.F. et al., "A hybrid approach to nanoelectronics," Nanotechnology (16):1040-1047, 2005.

Cerofolini, G.F. et al., "Strategies for nanoelectronics," Microelectronic Engineering (81):405-419, 2005.

Chen, Y. et al., "Nanoscale molecular-switch crossbar circuits," Nanotechnology (14):462-468, 2003.

Chen, Y. et al., "Nanoscale molecular-switch devices fabricated by imprint lithography," Applied Physics Letters 82 (10):1610-1612, Mar. 10, 2003.

Flanders, D.C. et al., "Generation of <50 nm period gratings using edge defined techniques," J. Vac. Sci. Technol. B 1(4):1106-1109, Oct.-Dec. 1983.

Melosh, N. et al., "Ultrahigh-Density Nanowire Lattices and Circuits," Science (300):112-115, Apr. 4, 2003.

Choi et al., "Sub-Lithographic Patterning Technology for Nanowire Model Catalysts and DNA Label-Free Hybridization Detection," Proceedings of the SPIE vol. 5220 Nanofabrication Technologies, 2003, pp. 10-19.

Nasrullah et al., "An Edge-Defined Nano-Lithography Technique Suitable for Low Thermal Budget Process and 3-D Stackable Devices," IEEE, 2003, pp. 502-505.

\* cited by examiner

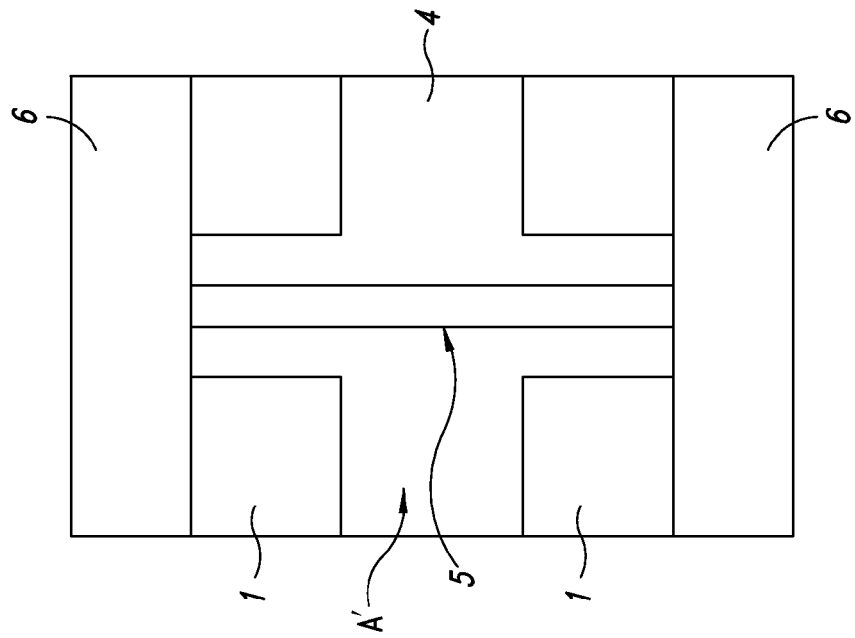
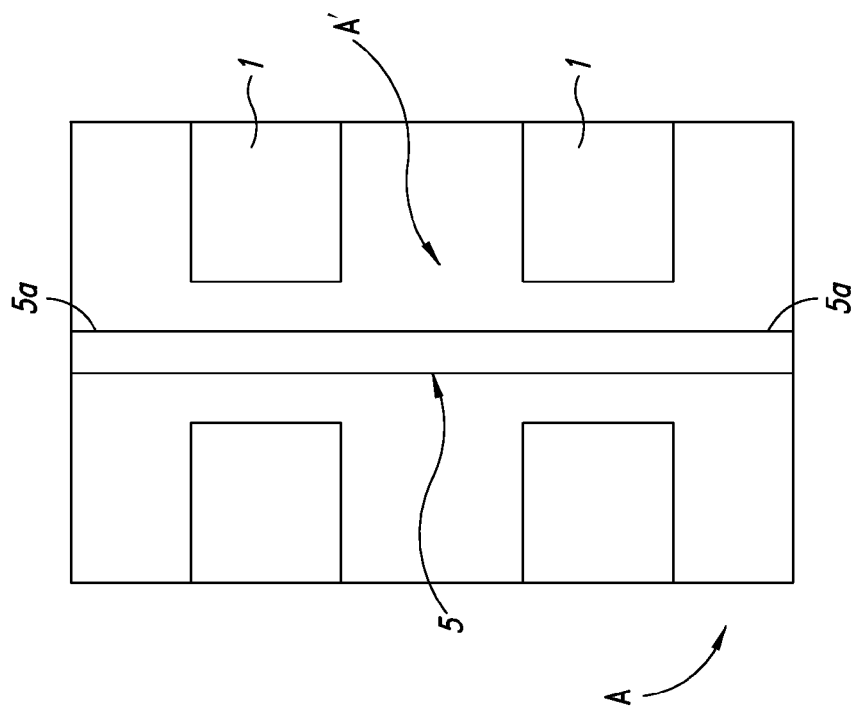

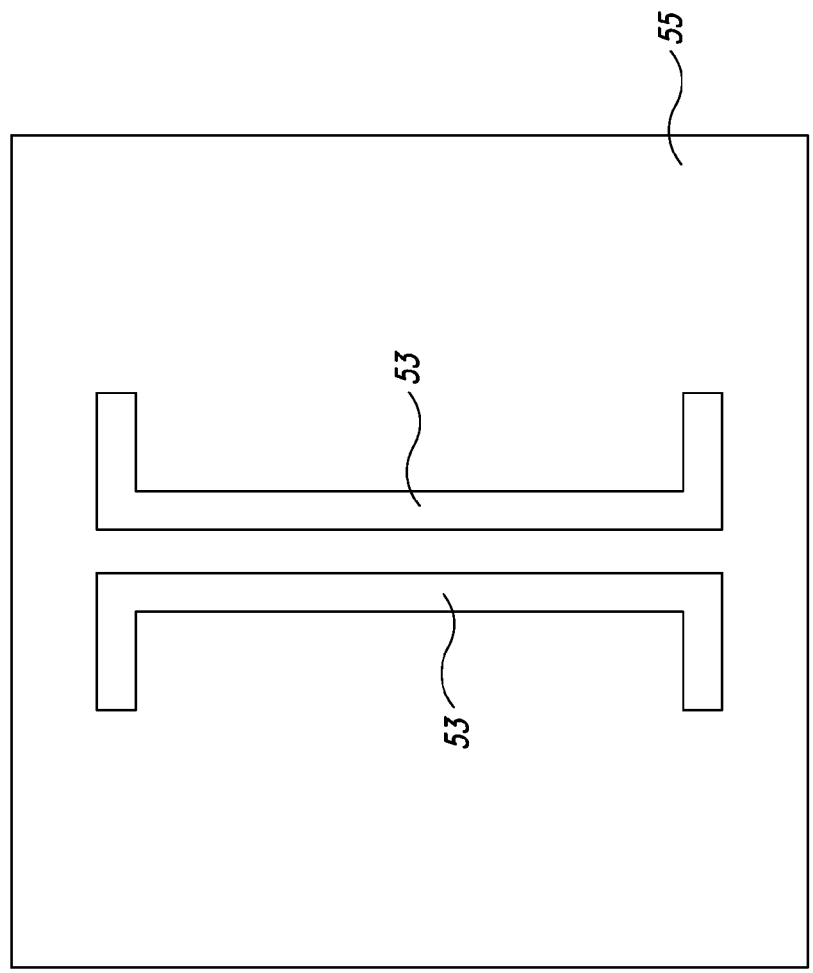

METHOD FOR REALIZING A NANOMETRIC CIRCUIT ARCHITECTURE BETWEEN STANDARD ELECTRONIC COMPONENTS AND SEMICONDUCTOR DEVICE OBTAINED WITH SAID METHOD

BACKGROUND

1. Technical Field

The present invention relates in its more general aspect to the field of nanometric component electronics and to the nano-manufacturing field.

In particular the invention relates to a method for realizing a nanometric circuit architecture in a semiconductor device between traditional or standard electronic components.

By standard electronic component, or just standard electronics, reference is made to components such as, for example, diodes, capacitors, MOSFET transistors, or portions thereof, obtained by means of photolithographic techniques, i.e., an electronics whose size depends, in the final analysis, on the photolithographic source wave length.

The invention also relates to a semiconductor device comprising a nanometric circuit architecture.

2. Description of the Related Art

As it is known, in the electronics field, the need to realize circuit configurations with a more and more reduced size is particularly felt.

The interest for a constant circuit structure miniaturization and thickening has nowadays pushed the electronics towards what is defined, in this particular technical field, the nanoera.

The nanoera advent, characterized by the capacity to realize nanometer-scale structures (NLS—nanometer length scale), has also allowed to put the grounds for the development of the so-called hybrid electronics, i.e., a particular field, wherein the "traditional" electronics of silicon technologies meets the nanometric world of molecular components realized via chemical synthesis.

Molecular components generally mean different-functionality molecules being able to perform specific actions, be they both electrical and mechanical.

On this set background, an integrated electronic circuit can be schematically represented as a circuit comprising a nanometric region or portion and a micrometric region or portion interacting therebetween.

The micrometric region is divided in turn in active areas and field, and it generally comprises transistors, capacitors, diodes and addressing devices, logics and standard-electronics memory devices. On the contrary, the nanometric region is intended to comprise the molecular devices housed for example in nanometric circuit architectures.

Despite the achieved results, the electronic component miniaturization to the extent of few tens of nanometers and the realization of circuits of the above-mentioned type has interested most of all the experimental aspect and the problem of the realization thereof on an industrial scale remained substantially unsolved.

This limit is mainly due to the fact that the realization of nanometric circuit architectures or structures within semiconductor device integrated circuits and the connection of these architectures to the device standard electronic components generally requires the use of electronic lithography (e-beam lithography).

Embodiments thereof have been developed by Y. Chen et al. and published in Appl. Phys. Lett. 82, 1610 (2003) and in Nanotechnology 14 462 (2003).

These techniques require expensive and complex instruments also characterized by particularly long lithographic etching times and they are thus unconvenient for being used to realize the whole nanometric portion within a semiconductor device integrated circuit.

Methods based on the Multi Spacer Patterning Technology are also known, being improving with respect to the most advanced lithographic techniques in the repetitive nanometric architecture realization. "Strategy in Nano-electronics"—Microelectro Eng.

Nevertheless, the electronic lithography is nowadays essential for realizing the contacts of said nanometric architecture in order to realize the connection to the semiconductor device standard components.

In this case, the circuit portion being involved in the electronic lithography, or however in any other latest-generation lithographic technique, although being more limited, however involves quite relevant realization times for an application on the industrial scale.

Moreover, despite the use of this kind of technologies only for reduced portions within a nanometric region, the problem of finding sufficiently powerful light sources or effective optical systems, capable to industrially operate in the electromagnetic spectrum region of the few tens of nanometers, is still unsolved.

The technical problem underlying this invention is to provide a method for realizing a nanometric circuit architecture in a semiconductor device between traditional electronic components overcoming said drawbacks.

BRIEF SUMMARY OF THE INVENTION

The solution idea underlying the present invention is to use the Multi Spacer Patterning Technology (MSPT) to obtain a nanometric circuit architecture being directly accessible and addressable by at least one standard electronic component within a semiconductor device.

Based on this solution idea the technical problem is solved by a method for realizing a circuit architecture of said type as defined in the attached claim 1.

It has been surprisingly found that it is possible to realize nanometric circuit architectures between standard electronic components, by realizing at first, by MSPT, a seed-spacer having a predetermined configuration, and afterwards, always by MSPT, using this seed-spacer as the ground to obtain said architecture being directly addressed toward integrated circuit active regions, and being thus directly addressable by a standard electronics.

The features and advantages of the method according to the present invention will be apparent from the following description of an embodiment thereof given by way of non limiting example with reference to the attached drawings.

BRIEF DESCRIPTION OF THE SEVERAL VIEWS OF THE DRAWINGS

FIGS. 2 to 6 show the substrate of FIG. 1 during further intermediate manufacturing steps of the architecture of FIG. 1 according to a method according to the invention;

FIGS. 12a to 12l show some steps of the method according to an alternative embodiment of the invention;

DETAILED DESCRIPTION

The steps being described hereafter do not form a complete method flow for obtaining a nanometric circuit architecture suitable to be directly addressed by a standard electronic component, and only those steps being necessary to an average expert in this field to understand the invention are described hereafter.

It is also worth noting that the figures are schematic views of portions of a substrate whereon an integrated circuit is realized during some method steps according to the invention and they are not drawn to scale, but drawn in order to emphasize the important features of the invention.

The present invention can be implemented by using the common techniques used in the semiconductor electronic device manufacturing, particularly traditional lithography or photolithography, and the Multi Spacer Patterning Technology (MSPT), the latter technology being used to realize said architecture.

Although known, for more simplicity it is worth briefly summarizing the peculiar aspects of MSPT through which it is advantageously possible to realize, with a great precision and control, spacers with an extremely reduced size.

MSPT is a reiteration of the Space Patterning Technique SPT, a technique through which it is possible to turn the thickness of a thin layer or film, of a predetermined material, deposited on a substrate (vertical dimension), into the width of a spacer of the same material (horizontal dimension).

This technique exploits the possibility to control in an extremely precise way the deposited layer thickness, together with the capacity of many materials to uniformly conform to the topography underlying them.

The possibility to turn a vertical dimension or extension in an horizontal one is allowed by the initial use of a seed-block providing at least one side wall extending perpendicularly to the substrate. The spacer which will be adjacent to the seed-block side wall is obtained by means of an anisotropic etching of the deposited layer.

The capacity to selectively remove different materials allows further spacers and differently complex structures to be obtained, after further controlled depositions and anisotropic etchings.

In practice, it is possible to realize a structure wherein only one dimension depends on the lithography, while the remaining two dimensions are obtained by controlling the deposited layer thickness, even within few nanometers.

If the material is silicon oxide, it is possible to obtain the layer through controlled deposition, for example through "CVD oxide (Control Vapor Deposition) or in alternative, and as it is often preferred for the higher control being performed, it is possible to obtain the desired layer by growing the oxide from the underlying silicon layer, for example by means of the "Thermal Oxidation" technique.

Figure 1A:
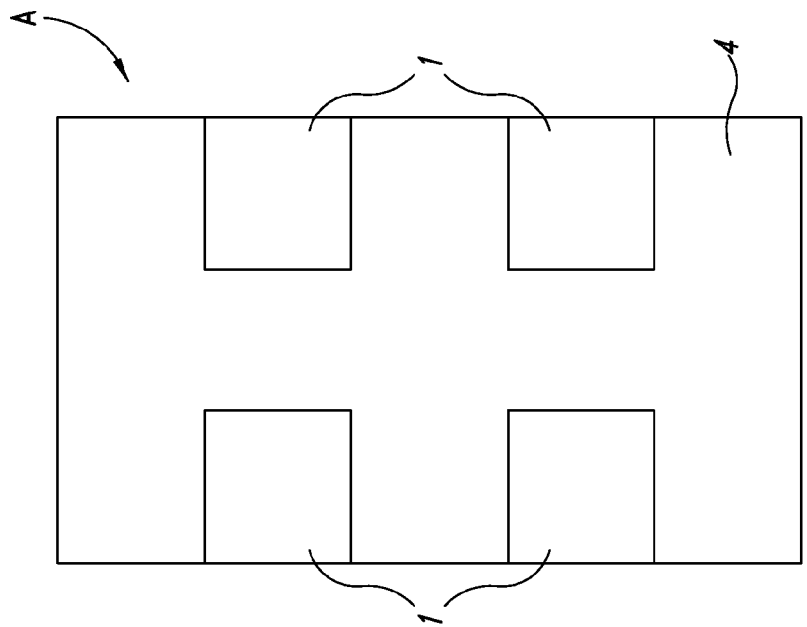
FIG. 1a shows the substrate of FIG. 1 during an intermediate manufacturing step of the nanometric circuit architecture obtained by a method according to the invention.
Figure 1:
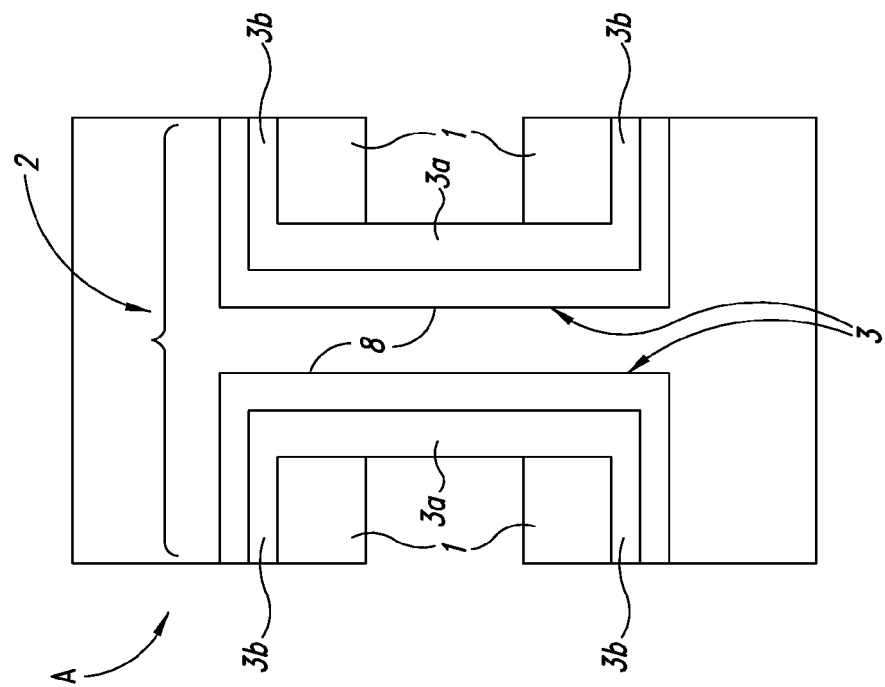
FIG. 1 is a partial schematic plan and enlarged-scale view of a substrate of a semiconductor device comprising a nanometric circuit architecture obtained by a method according to the invention.

Now with reference to FIG. 1, it shows a substrate A of a semiconductor device whereon an integrated circuit is realized. The substrate A comprises a plurality of active areas, in the example shown in the figure four active areas 1.

Preferably, these active areas 1 realize the contact, or a contact portion, with respective standard electronic components, for example the Source or Drain contact of a MOSFET transistor, and they can be for example heavily-doped substrate areas.

The four active areas 1 are obtained in turn by opening, through lithography, respective windows on the substrate A, which can be for example a silicon substrate.

These active areas 1 which are advantageously realized according to a matrix configuration (in the example a 2×2 matrix) have a size of a few hundreds of nanometers, to the masking tolerance limit, as it can be obtained by using the standard lithography, and they are thus parted from each other by substrate portions which have, at best, a similar size.

Always with reference to FIG. 1, a nanometric circuit architecture obtained by a method according to the invention is globally indicated with 2. In particular, in this example, the architecture 2 comprises two spacers 3 substantially being C-shaped.

Spacers 3, advantageously made of polysilicon, are the conductive portion of the architecture 2 and they realize nano-wires which comprise a first portion 3a extending at least partially in a region A' of the substrate A comprised between active areas 1, and at least one second contact portion 3b, substantially orthogonal to the first portion 3a, addressed towards, and extending up to cross at least partially, a respective active area 1.

Still with particular reference to the example shown in FIG. 1 it is noted that these second contact portions 3b are two for each nano-wire 3 and they advantageously correspond to the wings of the C of each nano-wire 3.

Still preferably, each second contact portion 3b entirely crosses a respective active area 1.

It must be remembered that active areas 1, according to a schematic view, belong to the so-called micrometric circuit region.

As far as portions 3a are concerned, extending at least partially outside the active areas 1, they can be intended for example to contact one or more molecular devices (not shown in the figures), with which they define, according to the same schematic view, the circuit nanometric component.

The architecture 2 can further comprise insulating spacers 8, for example C-shaped silicon oxide insulating spacers, realized in the lee of the conductive spacers 3 and comprised therebetween, as shown in FIG. 1.

In order to obtain the architecture 2 the method provides at first the realization of a seed layer or film 4, of a predetermined first material, on the substrate A, as shown in FIG. 1a.

This seed layer 4 is advantageously realized on the substrate A by controlled growth of an oxide layer, preferably silicon oxide from a monosilicon substrate. Nevertheless, according to the previous description, the seed layer 4 could be obtained by controlled deposition of a different material, for example by depositing a thin layer of silicon nitride or deposited silicon oxide or even by deposited-polysilicon oxidation.

The realization of a mask-spacer 5 extending on the substrate A outside active areas 1 and passing on said region A' of the substrate A comprised between active areas 1 is thus provided, as shown in FIG. 2.

In the example of the figure, the mask-spacer 5 of a second predetermined material, extends in the direction of the columns of the matrix arrangement of active areas 1, it could however extend, crossing said region A' of the substrate A, in the direction of the rows of the matrix configuration of active areas 1.

The mask-spacer 5 has few-nanometer-wide dimensions, preferably less than 50 nm.

It is useful to note that the mask-spacer 5 has end portions 5a extending for a section having a predetermined length, in the direction of the columns of said matrix arrangement, over the substrate region A'.

Similarly, the end portions 5a would go over the region A' of the substrate A if the mask-spacer 5 were realized along the matrix row direction.

The mask-spacer 5 is made of an insulating material, for example silicon nitride, through MSPT.

Figure 1B:
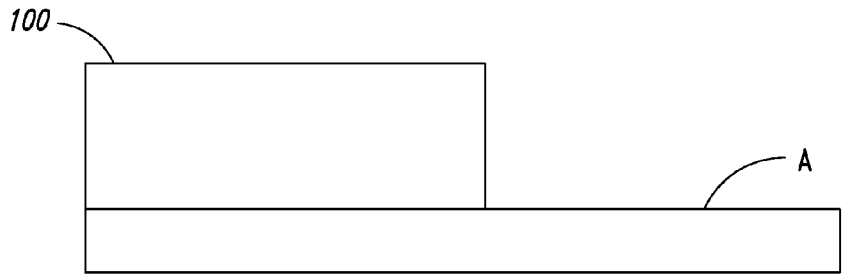
FIGS. 1b(a)-(d) show sectional views of the substrate of FIG. 1a taken along the line I-I during some intermediate manufacturing steps of the nanometric circuit architecture obtained by a method according to the invention.
Figure 1B:
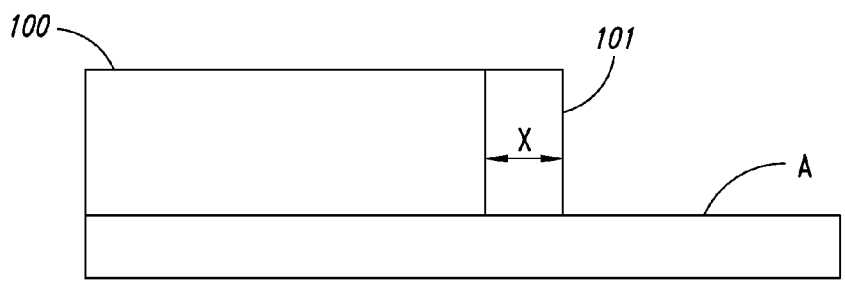
Figure 1B:
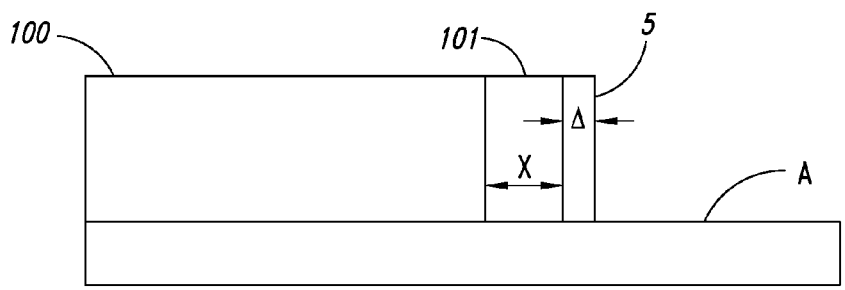
Figure 1B:
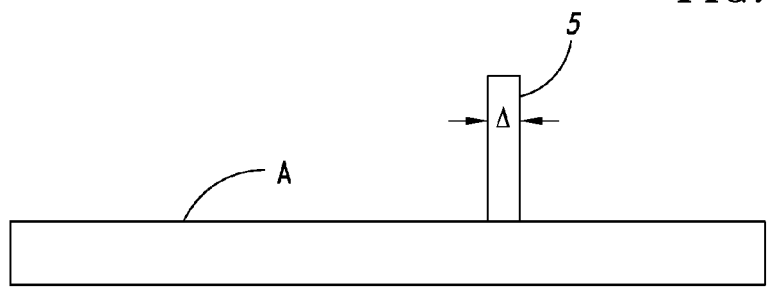

In particular, to realize the mask-spacer 5, a seed-block deposited on a peripheral portion of the substrate A and indicated with 100 is used at first, as shown in FIG. 1b(a).

Afterwards at least one layer having a predetermined thickness x is deposited, the thickness being adjusted (tuned) according to the position to be occupied by the mask-spacer 5, of a convenient material, defined as sacrificial layer (not shown), followed by a traditional anisotropic etching defining a sacrificial spacer 101 having a width corresponding to the thickness x of said sacrificial layer, as shown in FIG. 1b(b).

The thickness x of this sacrificial layer is chosen so as to realize a sacrificial spacer 101, which, extending from the seed-block 100, partially covers the region A' of the substrate A up in the lee of an intermediate portion thereof.

At this point, always through the MSPT, the mask-spacer 5 with the desired width Δ, preferably a width lower than 50 nm, is realized in correspondence with that intermediate portion, as shown in FIG. 1b(c).

Finally, the seed-block 100 and the sacrificial spacer 101 are selectively removed, as shown in FIG. 1b(d), leaving on the substrate A only the mask-spacer 5.

At least one further mask 6 is thus provided on the oxide layer 4 extending along a direction being substantially perpendicular to the mask-spacer 5.

In the example of the figures, the masks 6 are two and they are obtained by defining a resist layer through the traditional lithography.

Preferably, the resist layer is defined so as to realize these masks 6, each overlapping a respective end portion 5a of the mask-spacer 5, as shown in FIG. 3.

Figure 4:
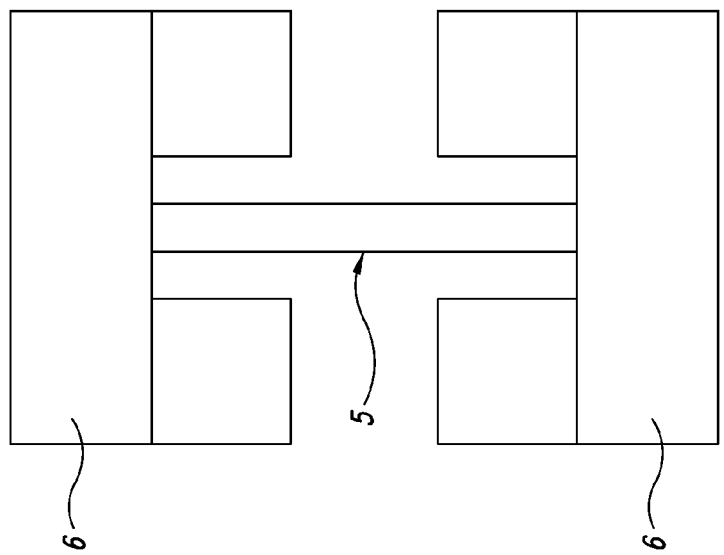

At this point the selective removal of the seed layer 4 is provided. This selective removal is obtained for example through chemical etching, generally plasma etching, through which the portion of oxide layer being still exposed is removed, i.e., the portion being not protected from the space-mask 5 and the resist masks 6, as shown in FIG. 4.

Figure 5:
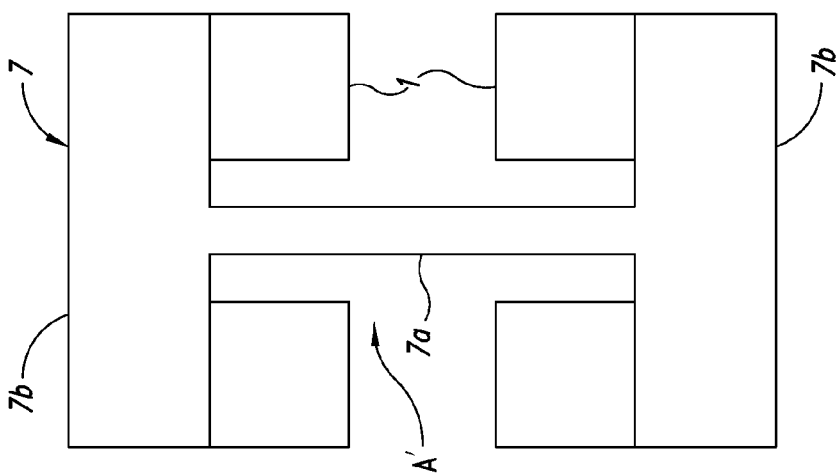

The further conventional selective removal of the mask-spacer 5 and of the masks 6 exposes the remaining portion of seed layer 4, here defined as seed-spacer and indicated with 7, as emphasized in FIG. 5.

In practice, a predetermined configuration has been realized at first through the mask-spacer 5 and the masks 6, which is then transferred, through the mask action, to the seed layer 4 realizing said seed-spacer 7, being advantageously I-shaped.

In detail, the seed-spacer 7 comprises a linear portion 7a, having a width corresponding to the width Δ of the mask-spacer 5, and a height of few nanometers, being adjustable (tunable) in the range between 2 and 50 nm as obtained by growing the oxide layer 4 on the substrate A. This linear portion 7a extends in the region A' of the substrate A comprised between the active areas 1 and it is connected in turn to two opposed portions 7b perpendicular thereto, each extending outside the region A' of the substrate A, in the lee of respective active areas 1, in the example two consecutive active areas 1 along the row direction.

A controlled deposition of a polysilicon layer, followed by an anisotropic etching of the deposited layer, realizes said nanometric circuit architecture 2 comprising a pair of conductive spacers or nano-wires 3, being specularly identical, substantially C-shaped, as shown in FIG. 1.

In detail, the circuit architecture 2 comprises two nano-wires 3 having each first portions 3a being parallel to each other, extending in the region A' of the substrate A outside the active areas 1, which can advantageously form conduction and control terminals for circuit-integrated molecular devices (not shown in the figures).

Moreover, each nano-wire 3 comprises two second contact portions 3b, being substantially orthogonal to a respective first portion 3a and each addressed towards, and extending up to cross at least partially, one respective active area 1.

Therefore, the circuit architecture 2 is, through said second contact portions 3b, directly arranged to be addressed, by means of the active areas 1, by a standard electronics.

Figure 6:
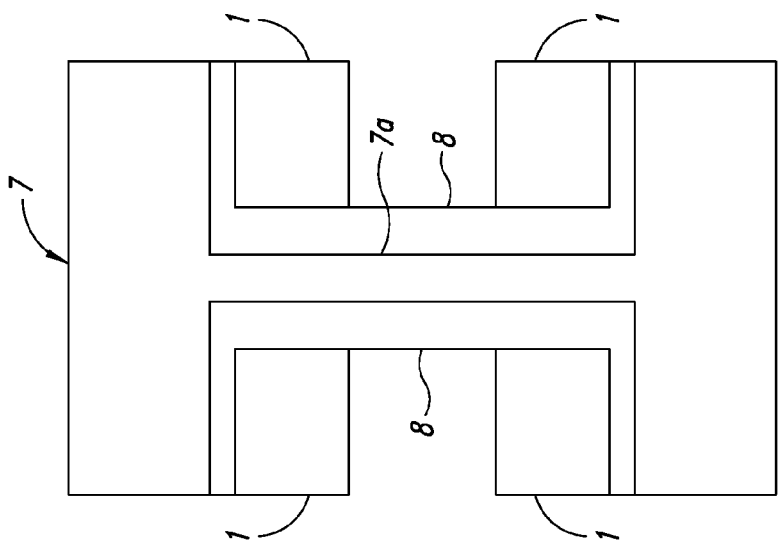

In a preferred embodiment of the present method, the realization of said substantially C-shaped nano-wires 3 is preceded by the realization of insulating spacers 8 so that the latter reproduce at least part of the profile of the seed-spacer 7. In particular substantially C-shaped insulating spacers 8 are realized, always through the MSPT, advantageously insulating spacers 8 made, for example, of silicon oxide as shown in FIG. 6.

The function of these insulating spacers 8 is to compensate possible excessive vacuums between said portions of the seed-spacer 7 and the active areas 1, mainly caused by the lithography precision limits.

In practice, these insulating spacers 8 serve as "spacers" or "shims" and they allow the second contact portions 3b of nano-wires 3 to be correctly positioned with respect to active areas 1.

Figure 7:
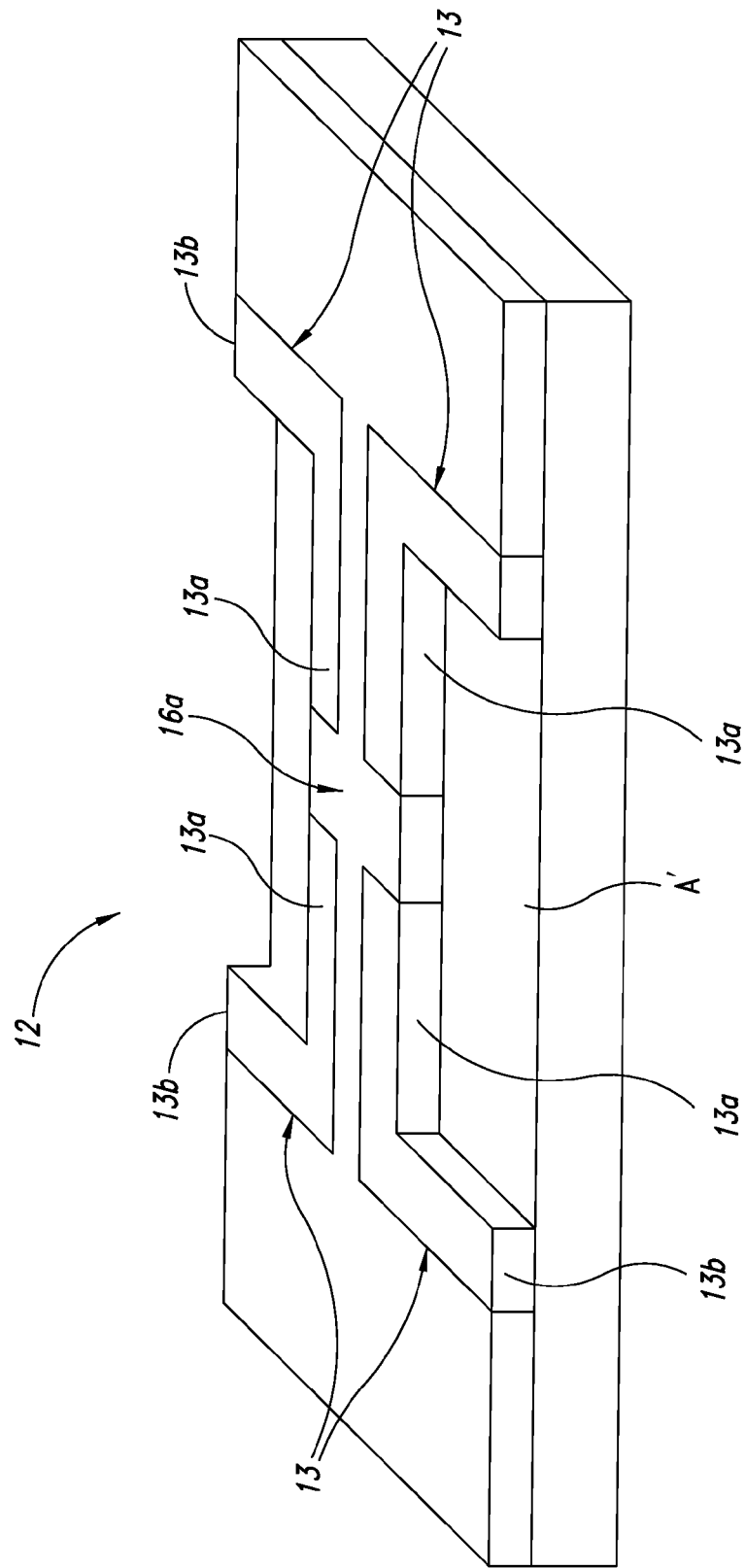
FIG. 7 shows on an enlarged scale and according to a perspective view the substrate of FIG. 1 comprising a nanometric circuit architecture obtained by means of an alternative embodiment of a method according to the invention.

Now, with particular reference to the example of FIG. 7, it shows a nanometric circuit architecture 12 obtained by means of an alternative embodiment of the invention. In this alternative embodiment the elements being structurally and functionally similar to the ones being previously described with reference to the previous embodiment will be indicated with the same numbers or references.

The circuit architecture 12 comprises a plurality of substantially L-shaped conductive spacers or nano-wires 13. In this case, each nano-wire 13 comprises a first portion 13a extending in the region A' of the substrate A comprised between the active areas 1, and a single second contact portion 13b, being substantially orthogonal to the first portion 13a, addressed towards, and extending up to contact, at least partially crossing, one respective active area 1.

Figure 8:
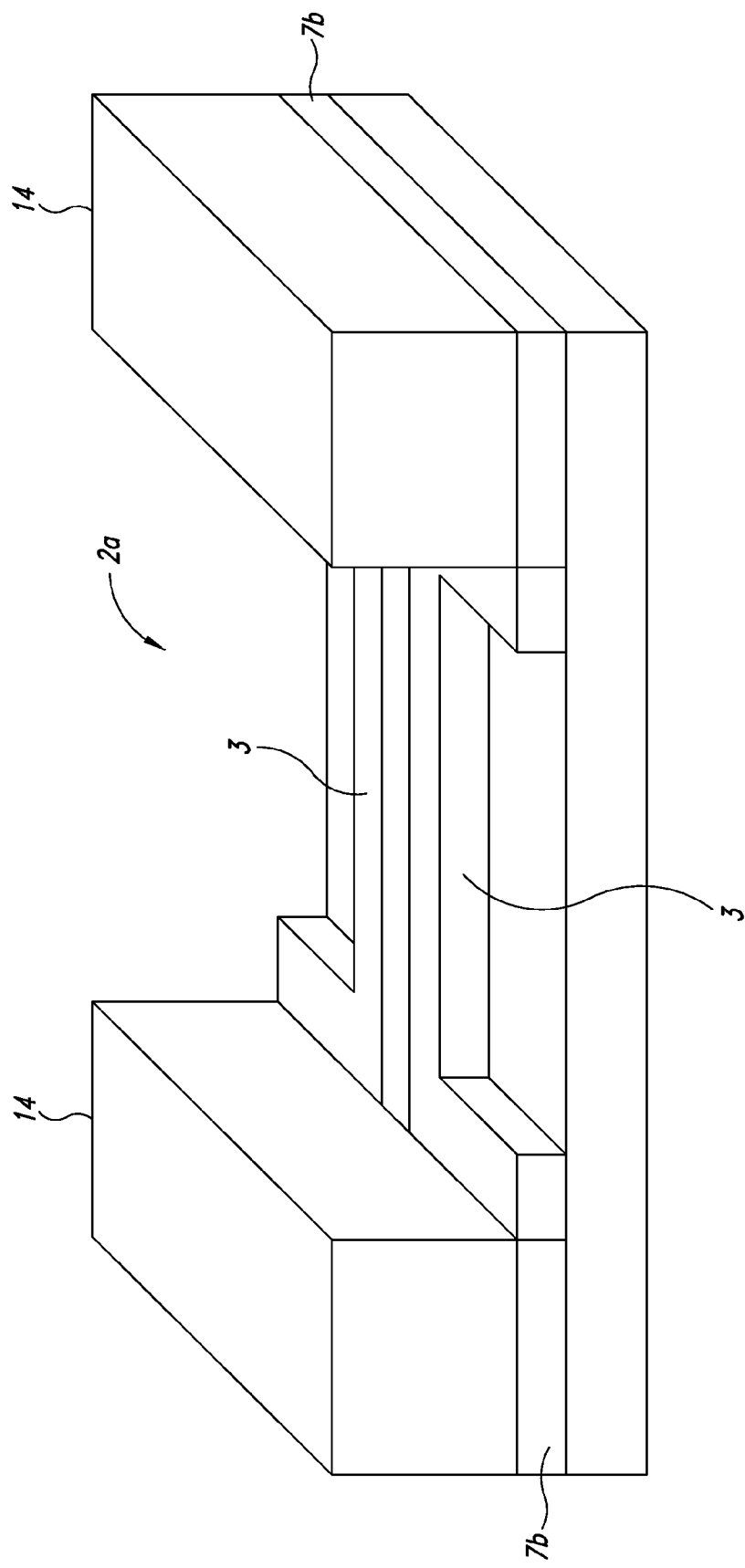
FIGS. 8 and 9 show some of the steps of a method according to the invention in order to obtain the architecture of FIG. 7.

In order to obtain the architecture 12, an architecture 2a is realized at first as shown in FIG. 8. This architecture corresponds to the architecture 2 previously shown with reference to FIG. 1, except that it has no insulating spacers 8.

Therefore, the architecture 2a is composed of two specularly identical substantially C-shaped nano-wires 3.

Nevertheless the insulating spacers 8 could be provided, without departing however from the scope of protection of the invention, according to what has been shown with reference to the previous embodiment.

Respective seed-blocks 14 are then deposited on opposed portions 7b of the seed-spacer 7 as shown in FIG. 8. Advantageously, these seed-blocks 14, which will be opposed and parallel, are realized through photolithography.

Afterwards, two covering spacers 15 are realized in the substrate region comprised between the two seed-blocks 14, to cover the architecture 2a.

Figure 9:
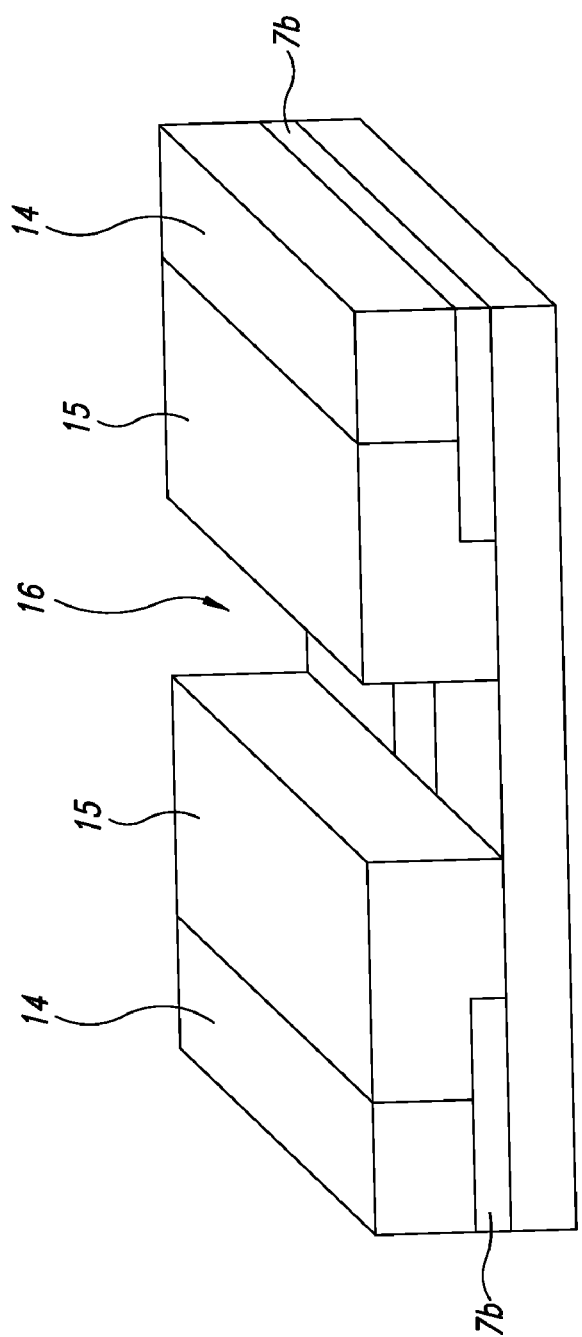

The covering spacers 15 are obtained by MSPT and they cover the whole architecture 2a, except for a reduced centrally-located portion thereof, which is an access window 16 to the architecture 2a, as shown in FIG. 9.

A selective oxidation step is then provided, through which the portion of nano-wires 3 being exposed through that window 16 is oxidized. The remaining portion of nano-wires 3, underlying the covering spacers 15 and protected therethrough, is not involved in the selective oxidation process.

The selective oxidation realizes, to the detriment of the conductive polysilicon, an insulating oxide portion extending crosswise to the pair of nano-wires 3. More particularly, an insulating strip 16a is realized, consequently obtaining said four substantially L-shaped nano-wires 13, as shown with reference to FIG. 7 wherein the architecture 12 is shown after removing covering spacers 15 and seed-blocks 14.

It must be said that an architecture of the type shown in FIG. 7, comprising substantially L-shaped nano-wires, can be realized, even by means of an alternative embodiment of the present method. In particular, with reference to what has been previously described to obtain the I-shaped seed-spacer 7, it is possible to point out the following.

Figure 10:
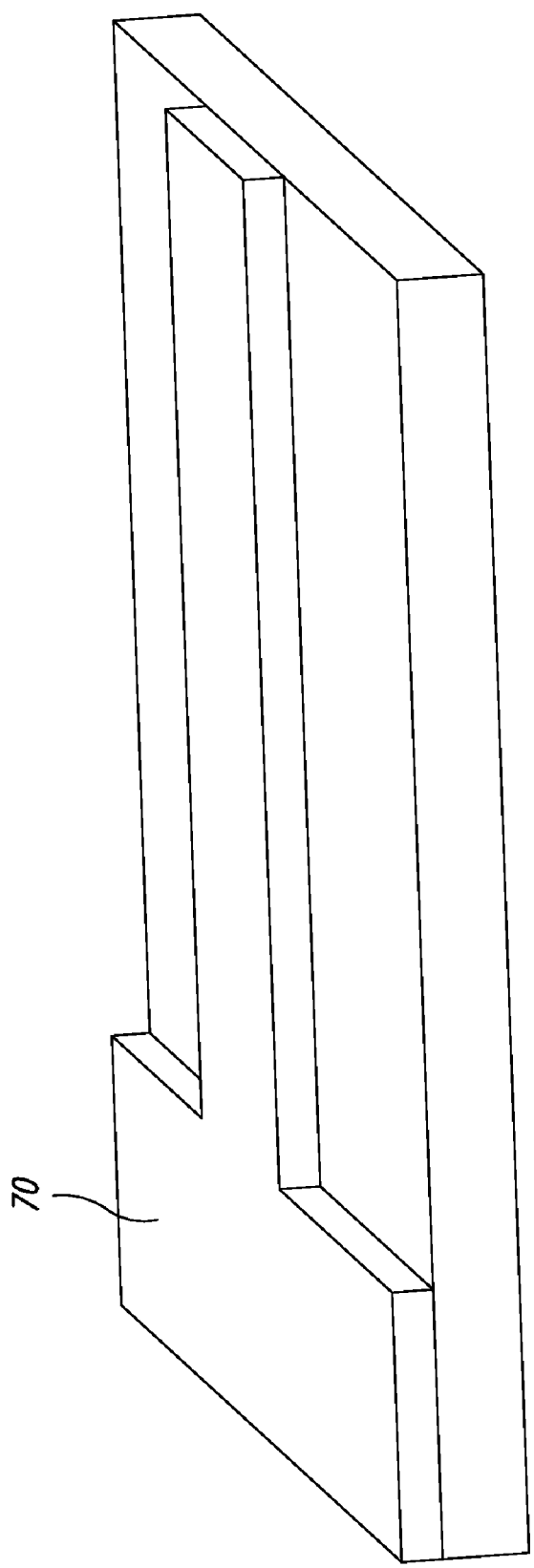
FIGS. 10 and 11 show a detail of the architecture of FIG. 7 during some steps of a method according to the invention.

If a single mask 6 is provided on the seed layer 4, rather than two masks 6 as above described with reference to FIG. 3, after removing the mask-spacer 5 and the resist mask 6, a substantially T-shaped seed-spacer 70 is obtained, as shown in FIG. 10.

In practice, the substantially T-shaped seed-spacer 70 corresponds to half of the substantially I-shaped seed-spacer 7.

Figure 11:
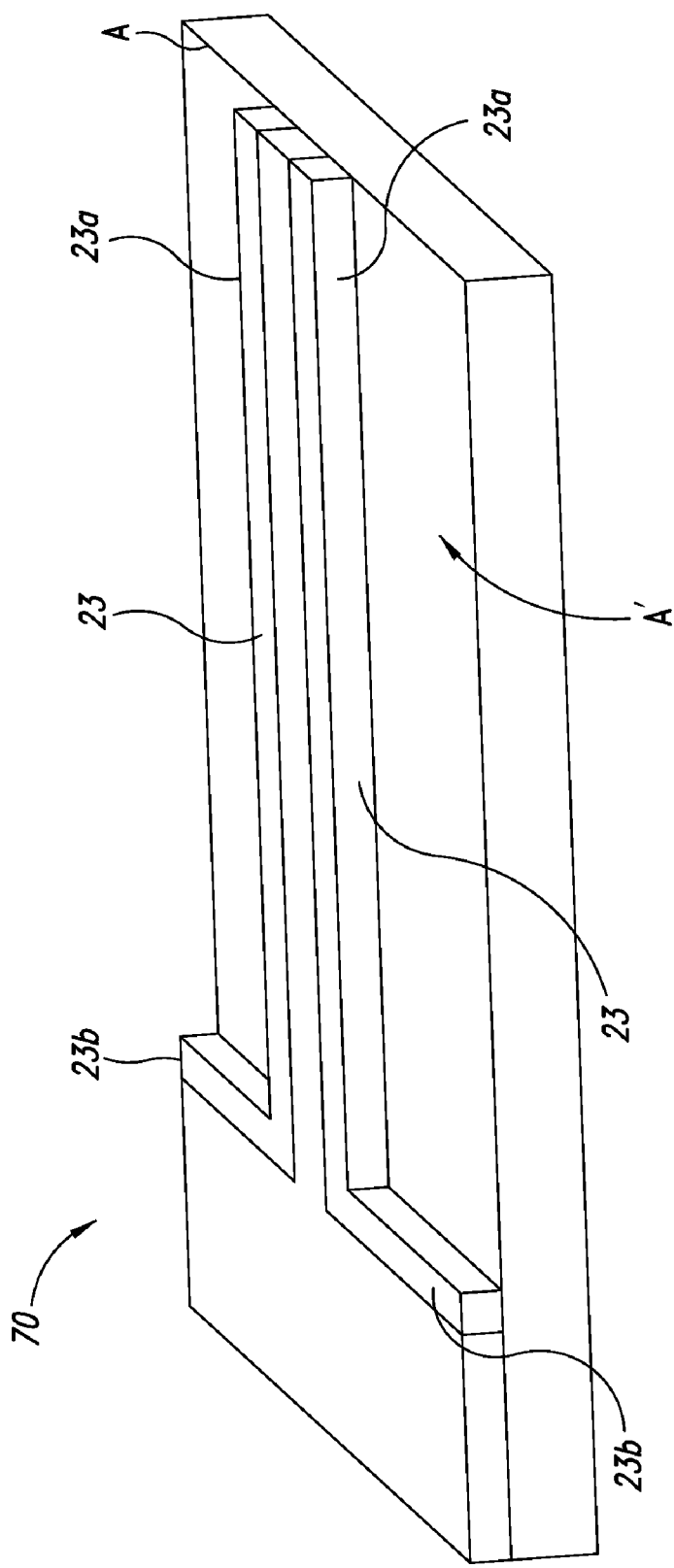

A controlled deposition of a polysilicon layer on the seed-spacer 70, followed by an anisotropic etching of the deposited layer, allows nanometric circuit architectures to be obtained, comprising pairs of nano-wires, being specularly identical, substantially L-shaped, as nano-wires 23 shown in FIG. 11.

It can be noted that nano-wires 23 comprise respective first portions 23a being parallel to each other and at least partially extending in the region A' of the substrate A outside the active areas 1, and respective second portions 23b, being substantially orthogonal to the first portions 23a contacting a respective active area 1, these active areas not being emphasized in the figure.

Figure 12:
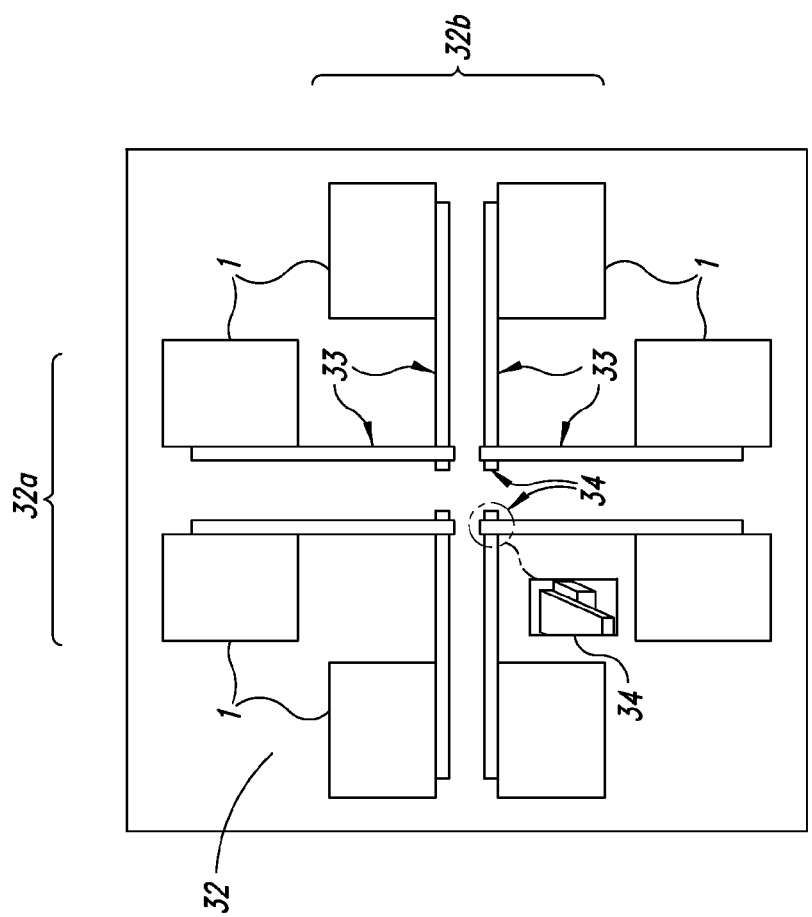
FIG. 12 shows a substrate of a semiconductor device comprising a nanometric circuit architecture obtained according to a further alternative embodiment of a method according to the invention.

Further more complex nanometric circuit architectures can be obtained, such as for example the architecture shown in FIG. 12.

This circuit architecture comprises substantially L-shaped nano-wires 33 which cross, as emphasized in the enlarged detail of FIG. 12, by realizing an architecture of the so-called "crossbar" type globally indicated with 32.

In particular, the crossbar circuit architecture 32 comprises eight nano-wires 33 overlapping by pairs, determining four crossing points 34. It can be noticed that the crossbar circuit architecture 32 comprises two architectures of the above-described type and shown in FIG. 7, each comprising four substantially L-shaped nano-wires.

In practice, these architectures, the lower one indicated with 32a and the upper one indicated with 32b, are orthogonal to each other and they are realized on two different planes, positioned parallelly the one on the other.

It can still be noticed that two nano-wires 33 in correspondence with a crossing point 34 are not in direct contact but parted by a separation layer 35.

Figure 12A:
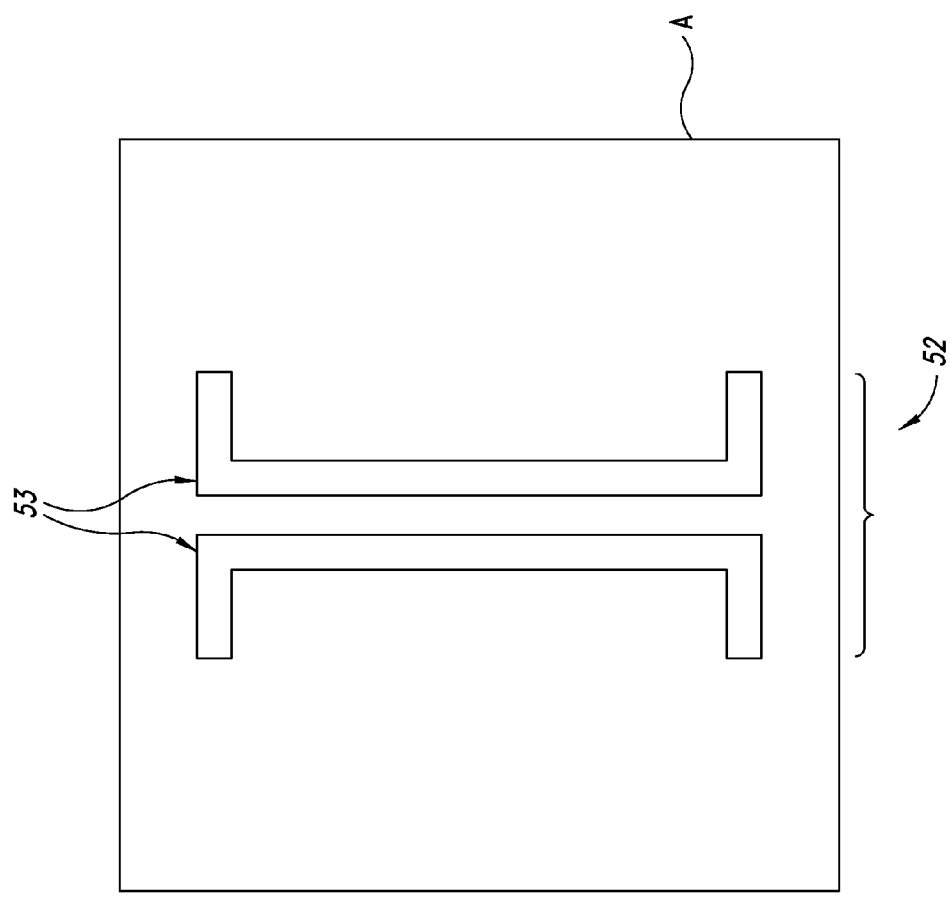
Figure 12B:
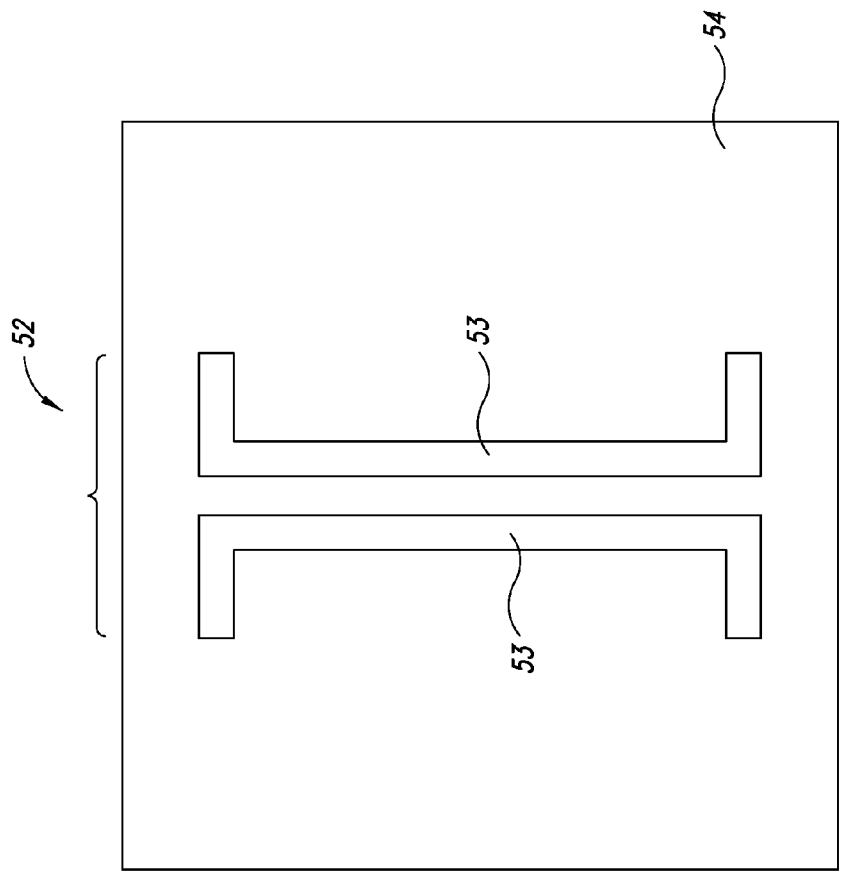
Figure 12D:
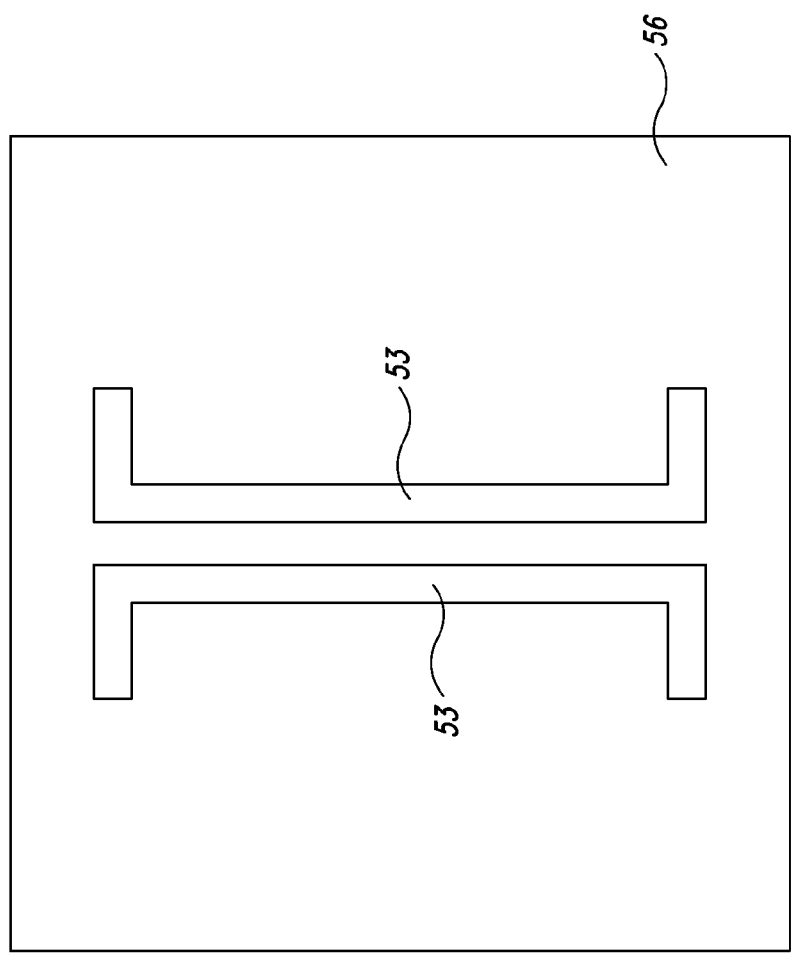
Figure 12E:
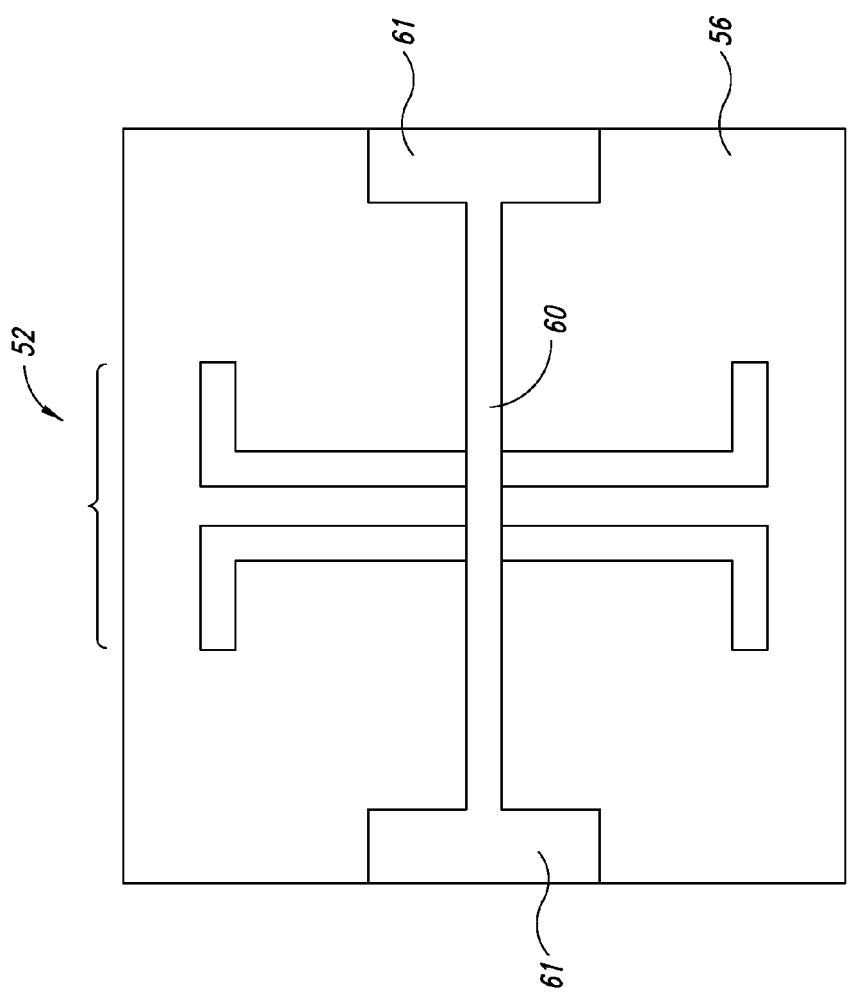
Figure 12F:
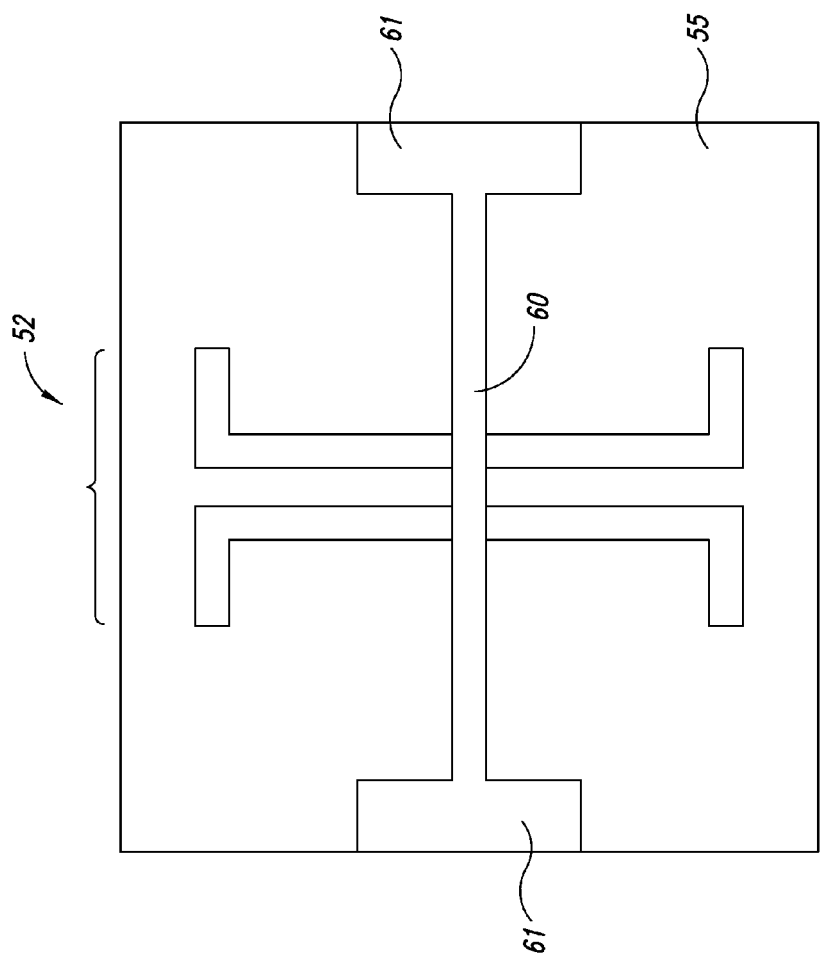
Figure 12G:
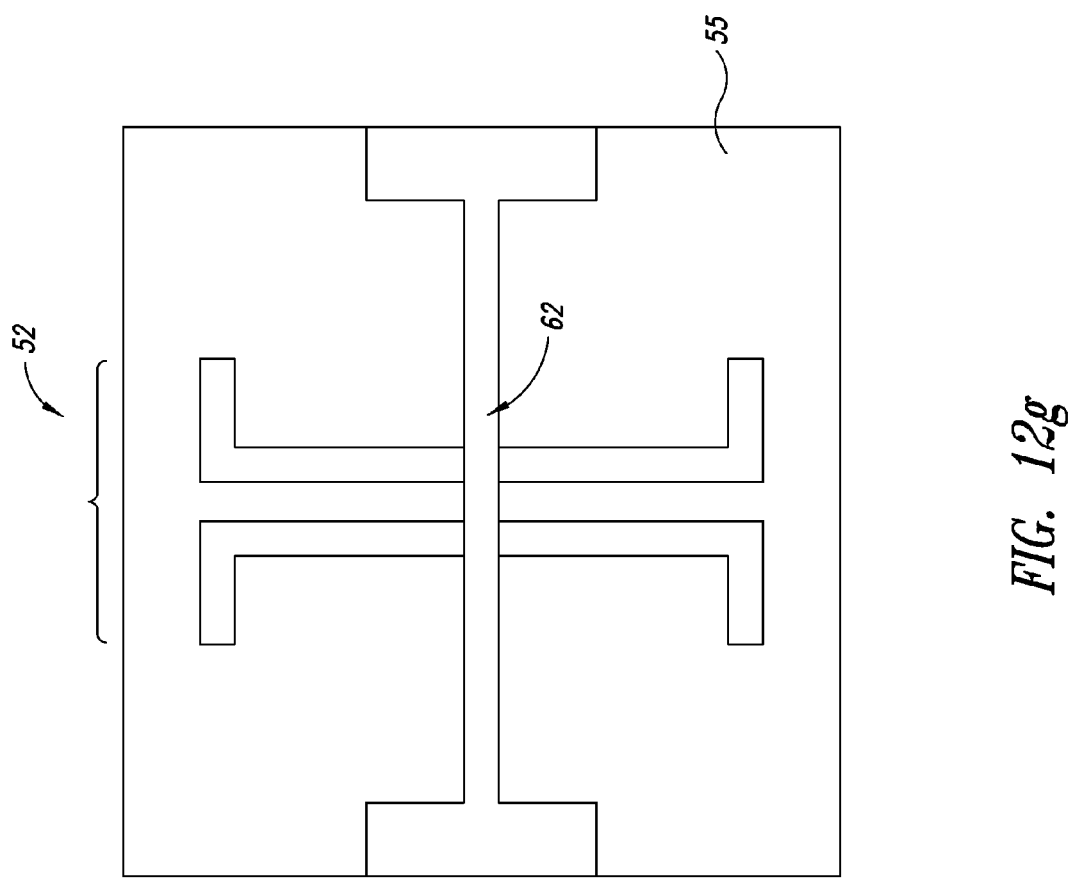
Figure 12H:
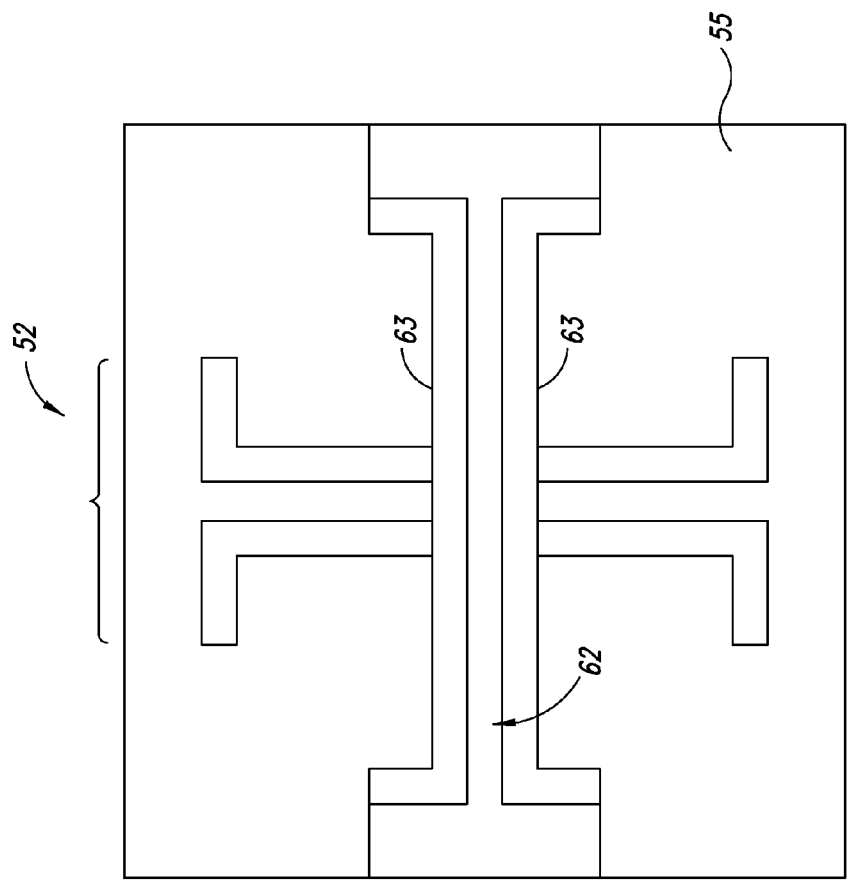
Figure 12I:
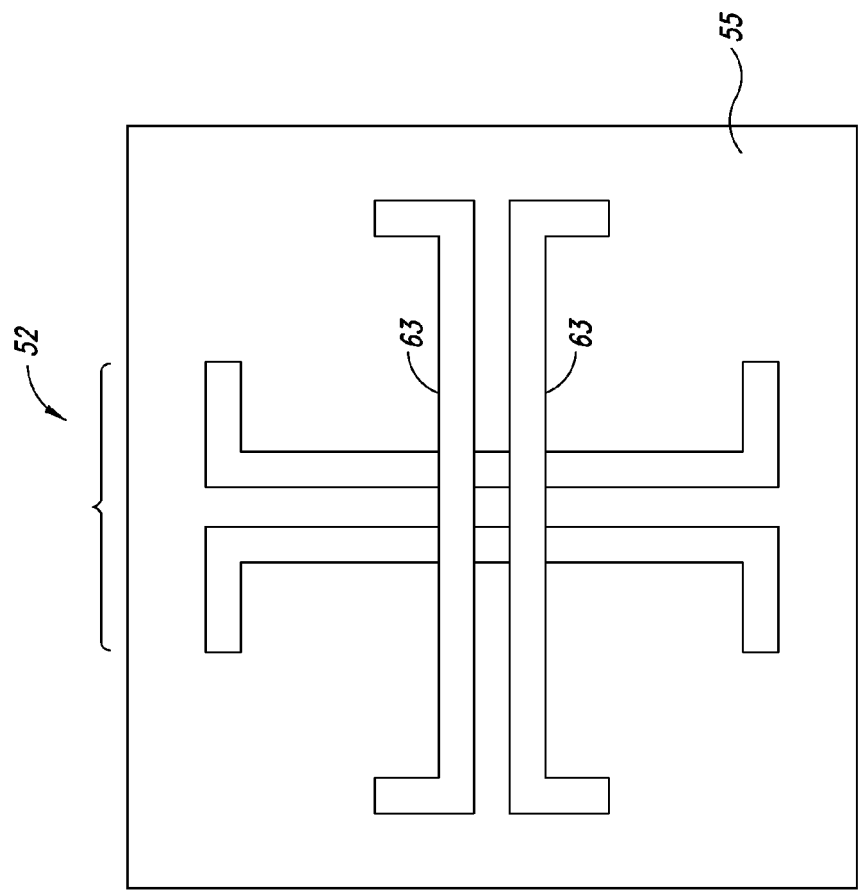
Figure 12J:
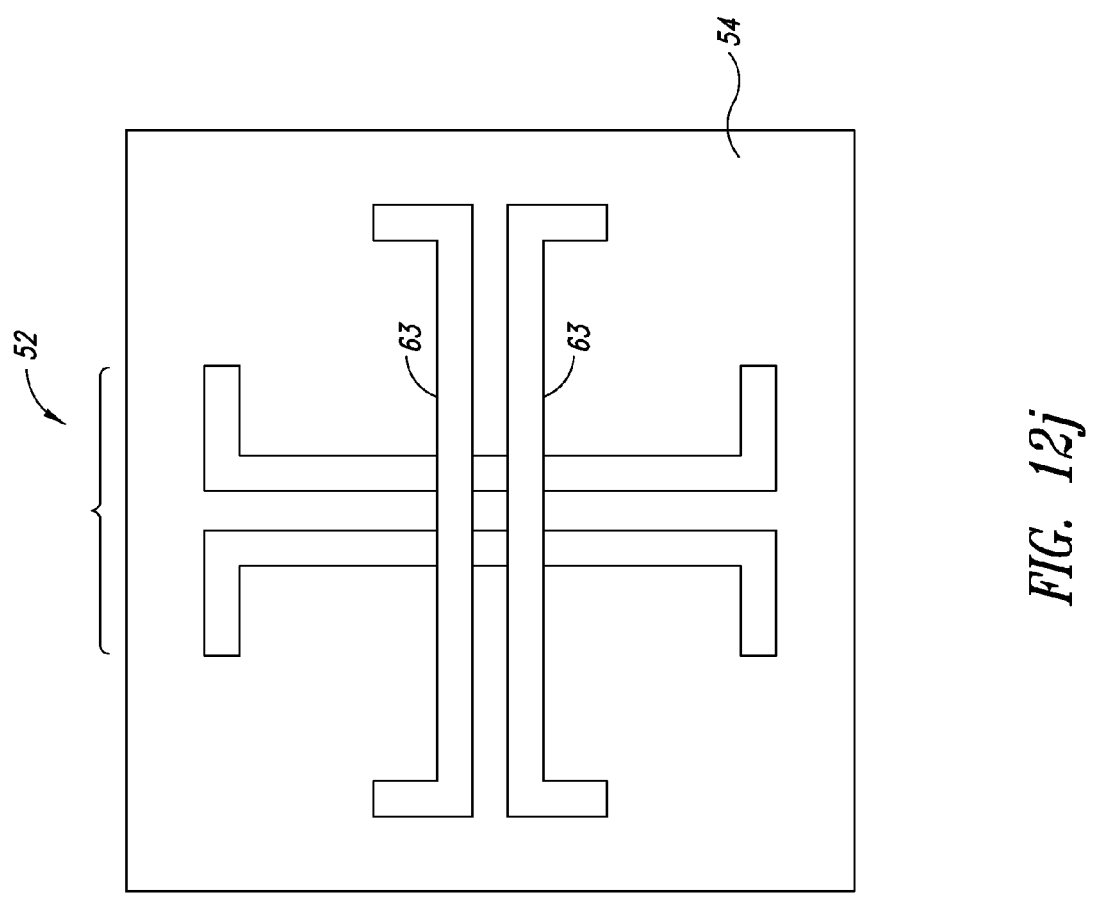
Figure 12K:
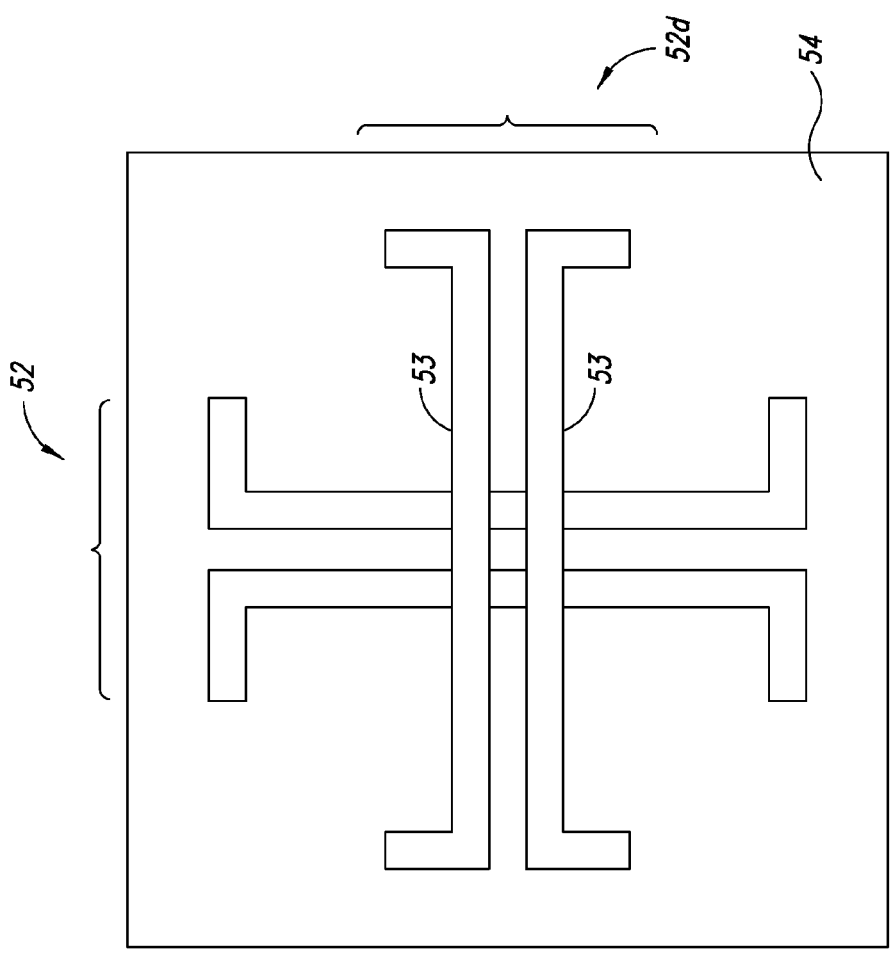
Figure 12I:
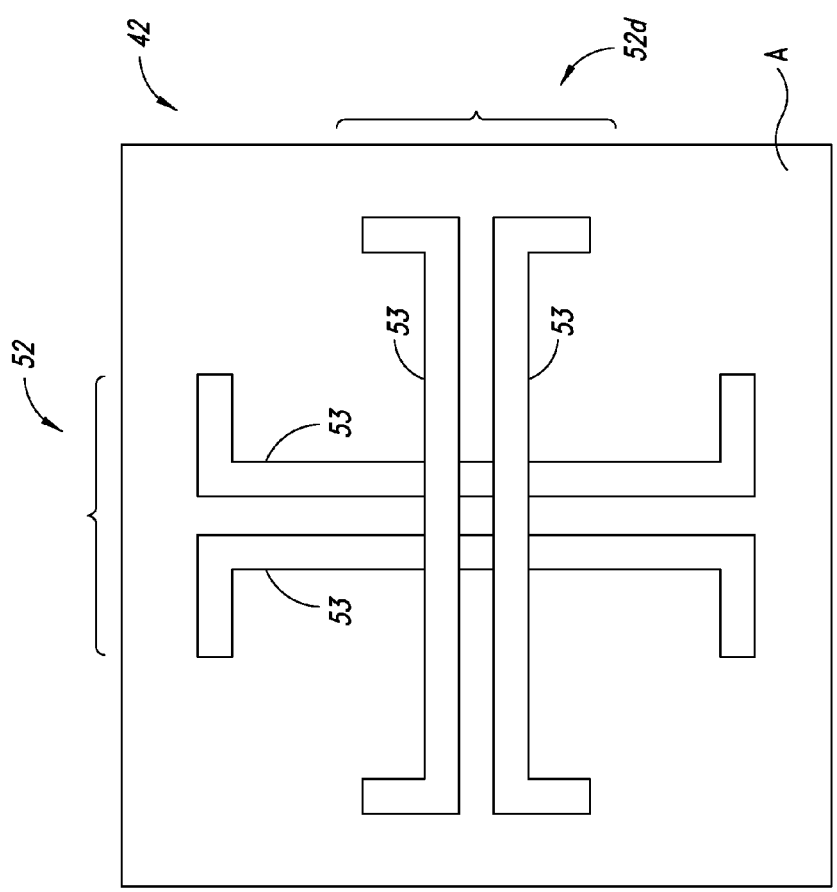
Figure 12M:
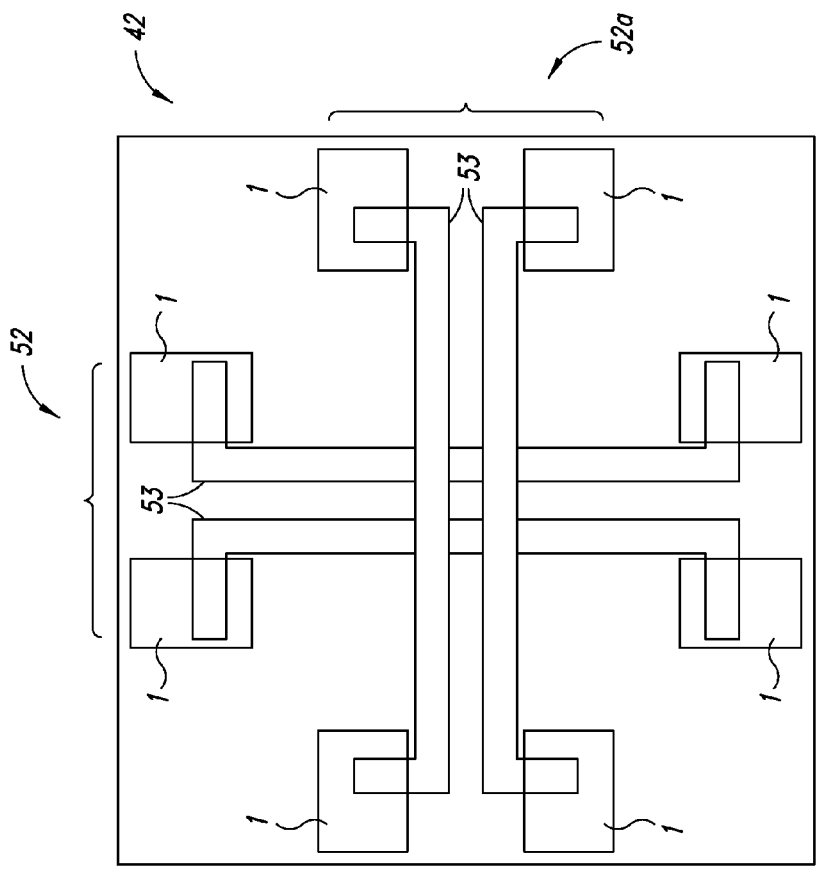
FIG. 12m shows a substrate of a semiconductor device comprising a nanometric circuit architecture obtained through the steps of the method described with reference to FIGS. 12a to 12l.

A crossbar architecture can also comprise substantially C-shaped nano-wires, as it is shown in FIG. 12m wherein a crossbar architecture between active regions 1 is indicated with 42, comprising a lower architecture 52 and an upper architecture 52a each comprising a pair of substantially C-shaped specularly identical nano-wires 53, these two pairs being substantially positioned the one perpendicular to the other.

The realization of a crossbar architecture is now described with reference to an architecture comprising substantially C-shaped nano-wires.

An architecture 52 being completely similar to the architecture 2a of FIG. 8 is realized at first for example on a monosilicon substrate A through the above-described method steps in order to obtain the crossbar architecture 42

The architecture 52 comprises a first pair of substantially C-shaped polysilicon nano-wires 53, as shown in FIG. 12a.

After realizing this first pair of nano-wires 53, a first oxidation, or light oxidation, step is performed, realizing a first oxide protective layer 54 being some nanometers thick, preferably less than five nanometers thick, adjustable on the molecular device size, as it is shown in FIG. 12b.

Then a covering step is provided, through which a covering layer 55, advantageously a polysilicon layer being a hundred nanometers thick and more, is deposited on the oxidized structure, as it is shown in FIG. 12c. Preferably, the latter step is followed by a leveling or planarization step, bringing this covering layer 55 at a predetermined constant height.

Afterwards, through a second oxidation step the thermal oxidation of the polysilicon covering layer 55 is performed. This second oxidation step realizes a second oxide layer 56 being less than a hundred nanometers thick, preferably between 5 and 70 nanometers thick, as shown in FIG. 12d.

At this point a mask-spacer 60, advantageously of silicon nitride is realized through the MSPT, in a completely similar way to what has been previously described, being less than 50 nanometers wide, as shown in FIG. 12e. The mask-spacer 60 is realized along a substantially perpendicular direction to nano-wires 53 and it preferably overlaps these nano-wires 53 along a barycentric line thereof.

Still similarly to what has been previously described, the lithographic realization of two resist masks 61 is thus provided, overlapping respective opposed end portions of the mask-spacer 60, and realized substantially perpendicular thereto, as shown in FIG. 12e.

Then a selective removal step, advantageously by chemical etching, removes the second oxide layer 56 in the portion not being protected by the mask-spacer 60 and by masks 61, as shown in FIG. 12f.

A further selective removal step, this time towards the resist and the silicon nitride, removes the masks 61 and the mask-spacer 60 obtaining a substantially I-shaped oxide seed-spacer 62, as it is shown in FIG. 12g.

This seed-spacer 62 is then used to realize, through the MSPT, a pair of substantially C-shaped covering spacers 63, advantageously obtained with silicon nitride which will then serve as a non-lithographic mask for the underlying polysilicon layer, as it be more apparent in the following description.

Then, a further selective removal step towards the oxide removes the seed-spacer 62 as shown in FIG. 12i. Finally, still through a selective removal step, this time towards the covering layer 55, the polysilicon layer is removed except for the portion not being masked by the covering spacers 63, as shown in FIG. 12j.

Still a selective removal step towards the silicon nitride removes the covering spacers 63 and it allows an upper architecture 52a to be obtained, comprising a second pair of substantially C-shaped polysilicon nano-wires 53, substantially having the same size as the pair of covering spacers 63, as shown in FIG. 12k.

Finally, a last selective removal towards the first oxide protective layer 54 leads to said crossbar architecture 42 shown in FIG. 12l being formed, comprising a lower architecture 52 and an upper architecture 52a, each comprising a pair of substantially C-shaped specularly identical nano-wires 53 crossing in four points.

A crossbar circuit architecture 32, 42 of the above-considered type is particularly advantageous if it is used to contact molecular devices in an hybrid electronic circuit.

In fact the nano-wire particular crossed structure not only allows a molecular device to be contacted in several points, for example several molecule ends even having different functions, but also housings for said molecular devices to be realized, favoring the insertion and holding thereof in an hybrid electronic device.

It is important to notice that the above-described method also allows said crossbar architecture 32 to be obtained, comprising substantially L-shaped nano-wires and described with reference to FIG. 12. In that case it is possible to advantageously start from the architecture 12 of FIG. 7 wherein an electric separation (insulating strip) is provided between substantially L-shaped nano-wires. It is then sufficient to repeat the just-described method steps providing to realize the insulating strip to the detriment of the conductive polysilicon of the upper architecture 32b nano-wires before the selective removal step of the oxide first protective layer 54 originally grown on the lower architecture 32a.

Figure 12N:
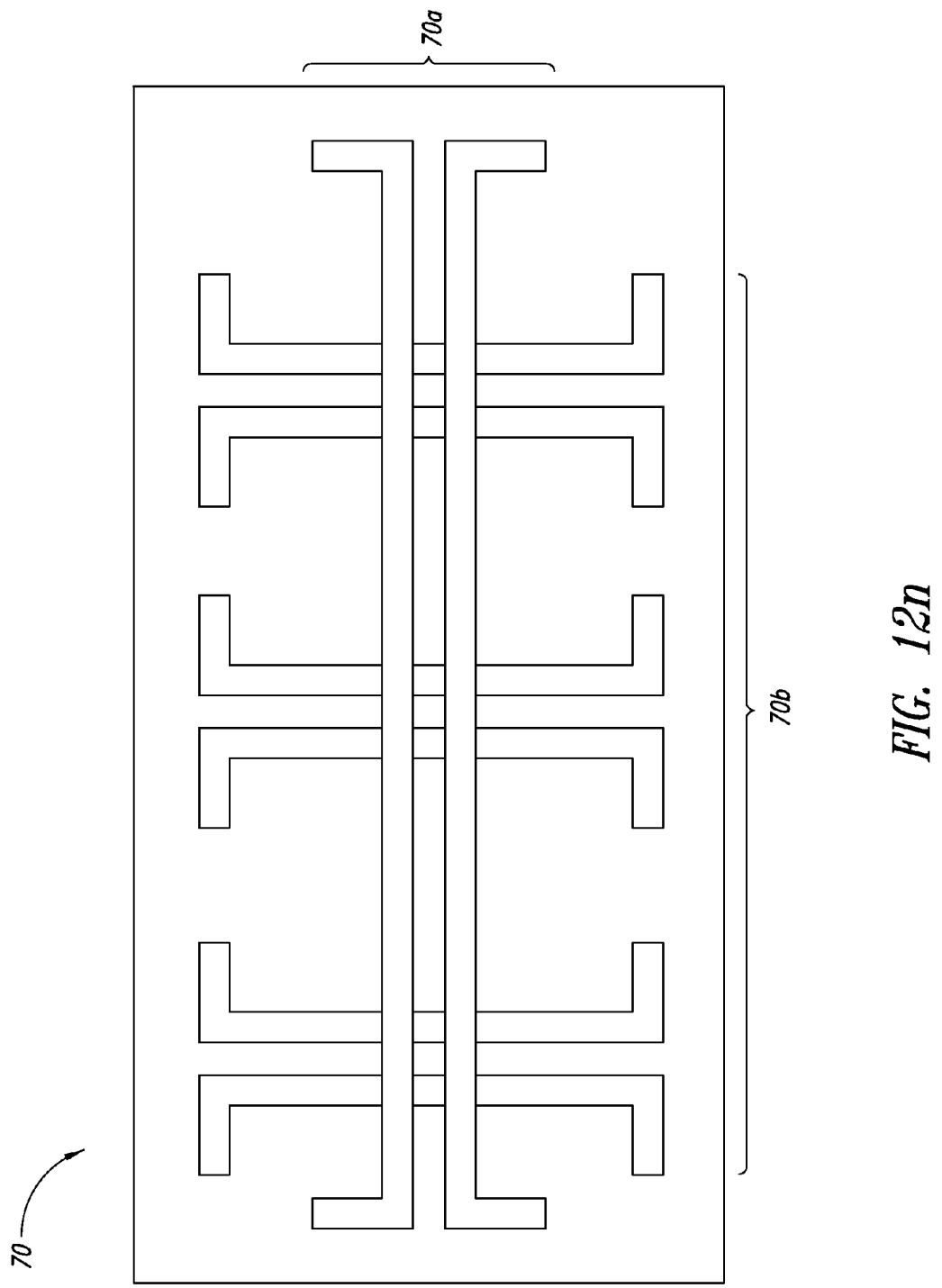
FIGS. 12n to 12r show a substrate of a semiconductor device comprising a nanometric circuit architecture still according to further alternative embodiments of a method according to the invention.
Figure 12O:
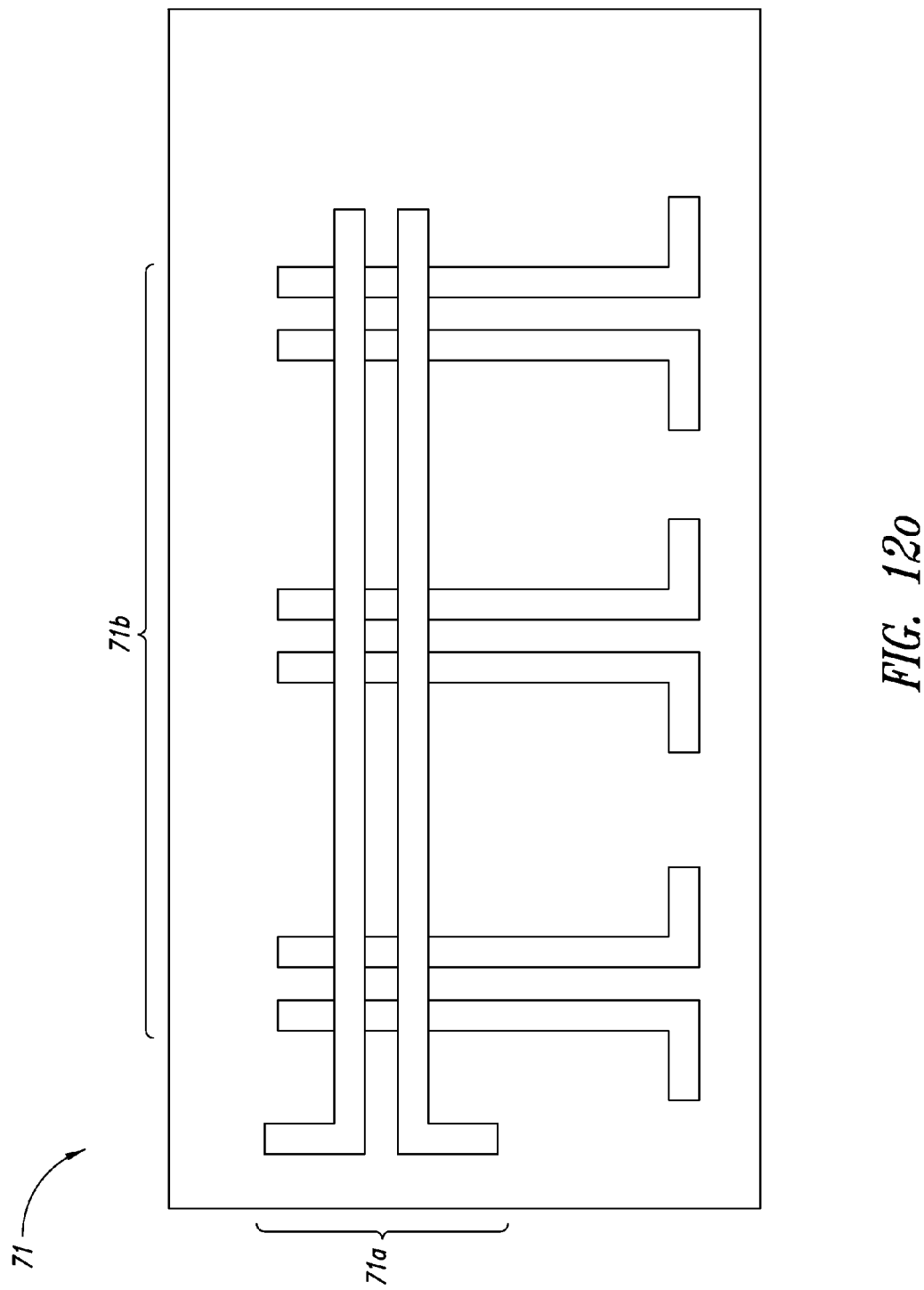
Figure 12P:
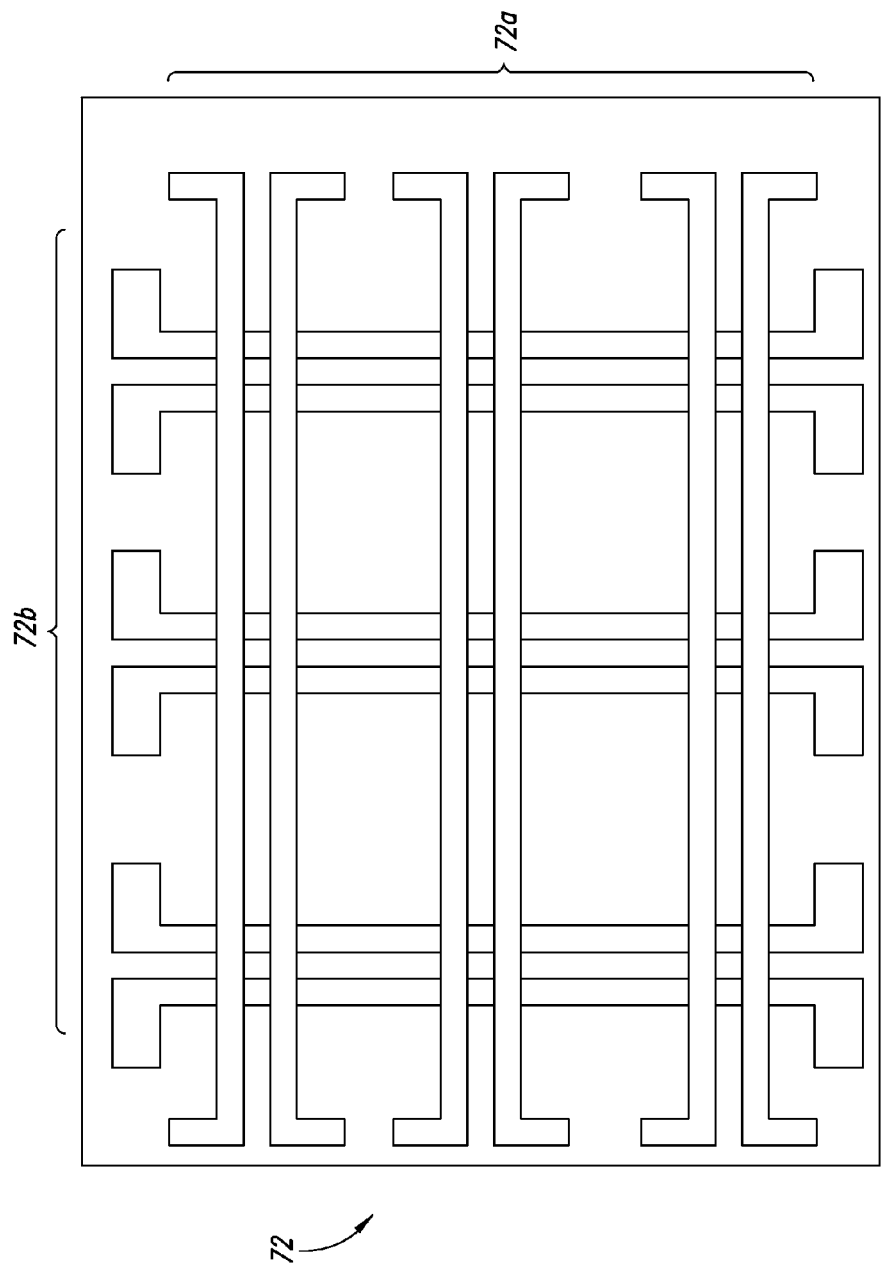
Figure 12Q:
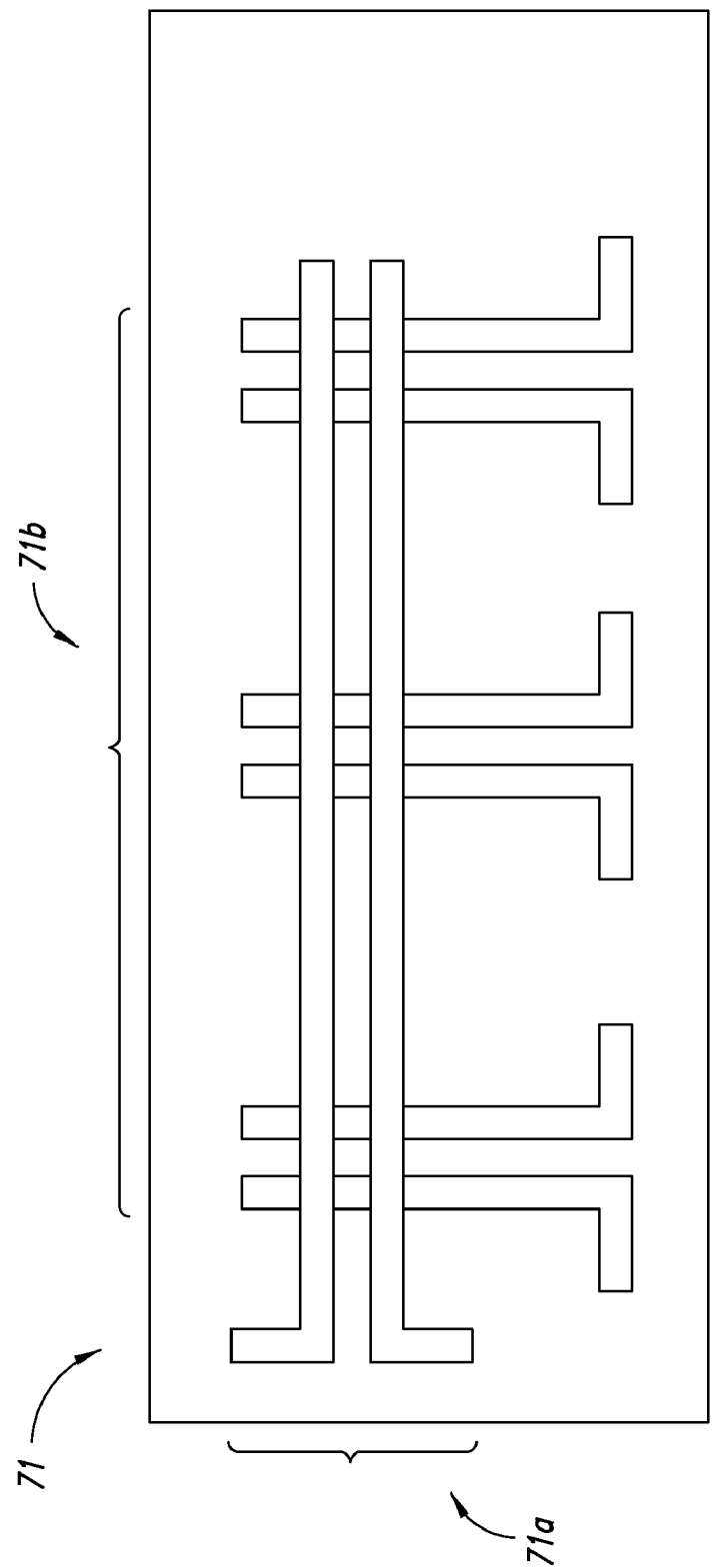
Figure 12R:
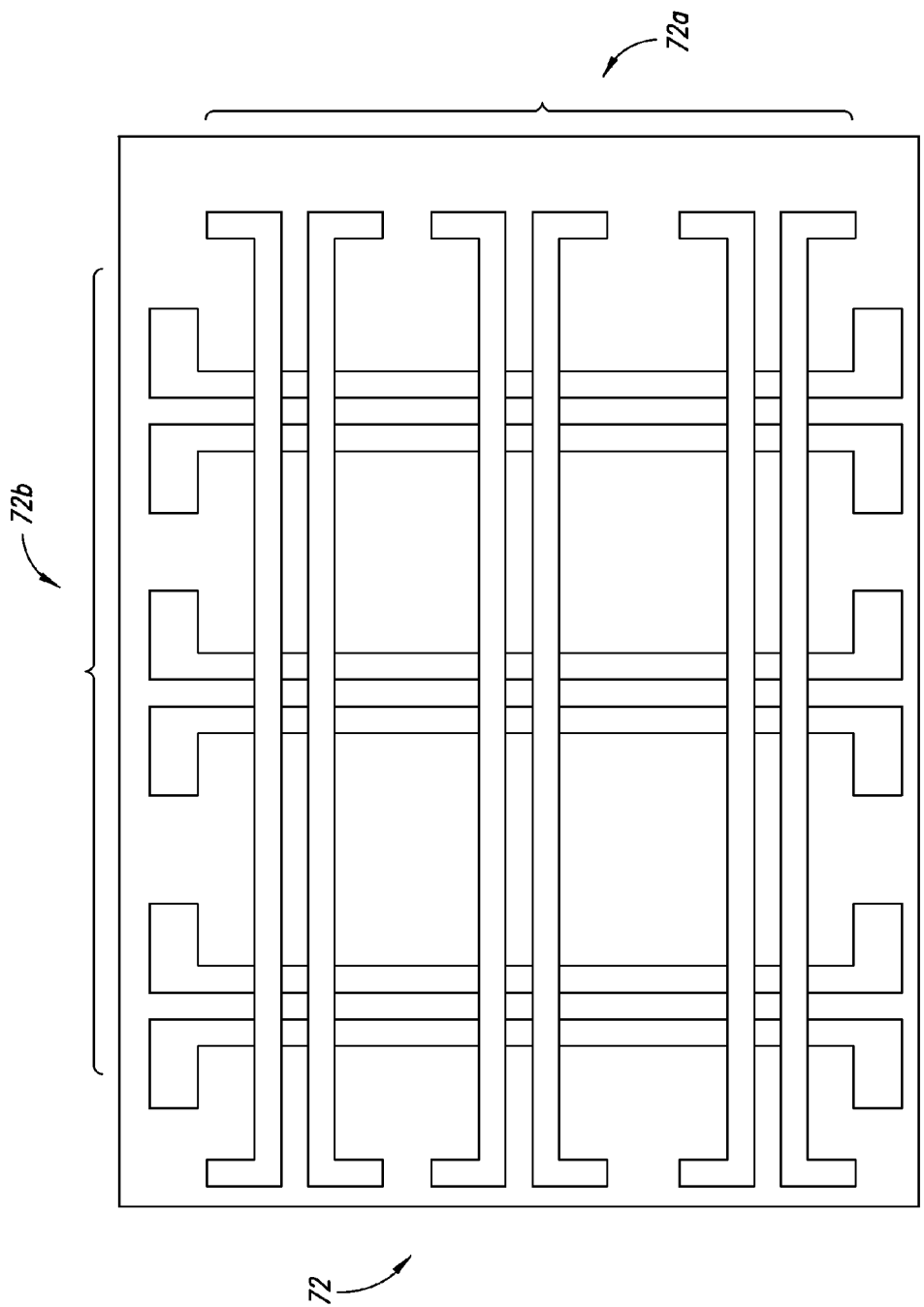

Further more complex crossbar architectures can be provided, such as the ones shown by way of example in FIGS. 12n, 12o and 12p and respectively indicated with 70, 71 and 72.

In particular crossbar architectures 70 and 71 comprise each an upper architecture 70a and 71a comprising a pair of substantially C-and-L- respectively shaped specularly identical nano-wires crossing a plurality of pairs of nano-wires being positioned parallel to each other forming respective lower architectures 70b, 71b.

In the examples of the figures the nano-wires of each pair are specularly identical and substantially C-and-L respectively shaped.

The architecture 72 comprises a first upper architecture 72a comprising a plurality of pairs of specularly identical nano-wires crossing a second plurality of pairs of specularly identical nano-wires of a lower architecture 72b. In particular in the example of the figure each of the three pairs of nano-wires of a lower or upper architecture 72a, 72b, crosses three pairs of nano-wires of the other lower or upper architecture 72a, 72b.

The realization of said crossbar architectures 70, 71 and 72 is obtained through the method steps being previously described with reference to the crossbar architectures 32 and 42 of FIGS. 12 and 12m. It must also be noted that the crossbar circuit architectures like the above-described ones can be realized through an alternative embodiment of the present method.

In fact it is possible to obtain more architectures of the same type, with no need to repeat each single step of the above-described method. This is allowed by the use of a mold, obtained through a method according to the invention, and used in a known imprint lithography process, as it will be more apparent in the following description.

To this purpose it is useful to step backwards and go back to the respectively I-and-T-shaped seed-spacers 7 and 70. The following description holds for both these seed-spacers, therefore for simplicity of illustration only a T-shaped seed-spacer will be taken into account, such as the one indicated with 70 in FIG. 10.

Figure 13:
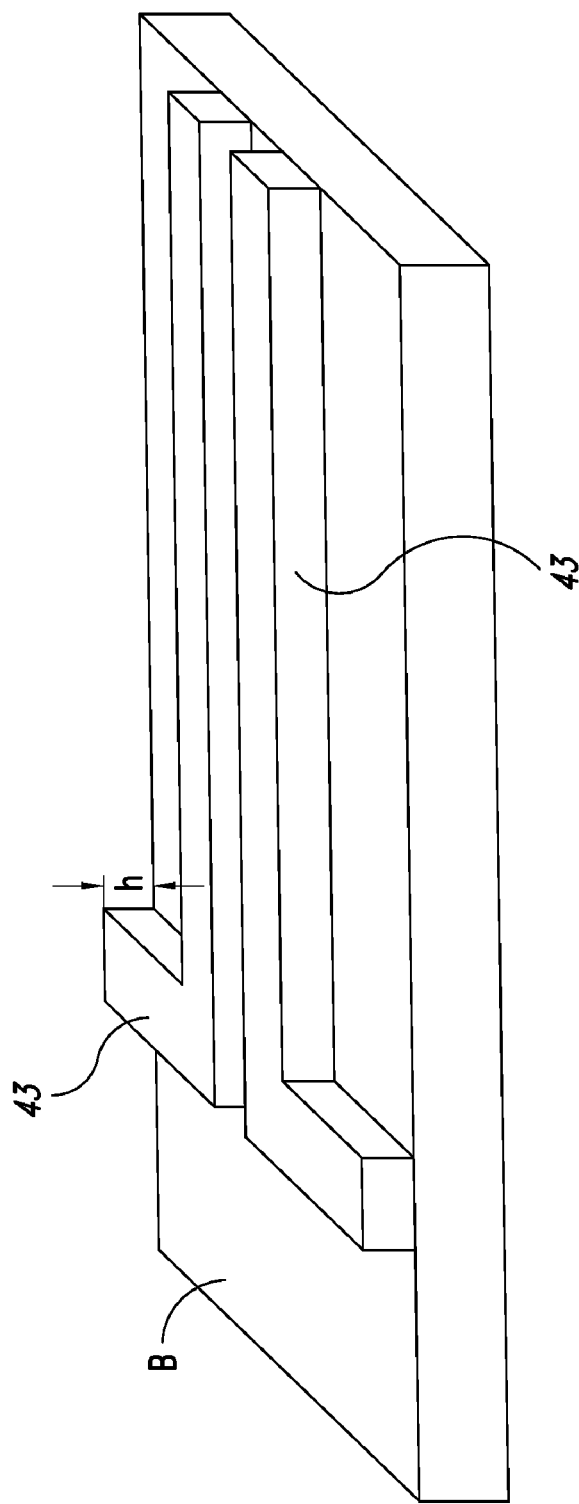
FIGS. 13, 14, and 15 show a substrate comprising nanometric architectures obtained according to further alternative embodiments of a method according to the invention.
Figure 13A:
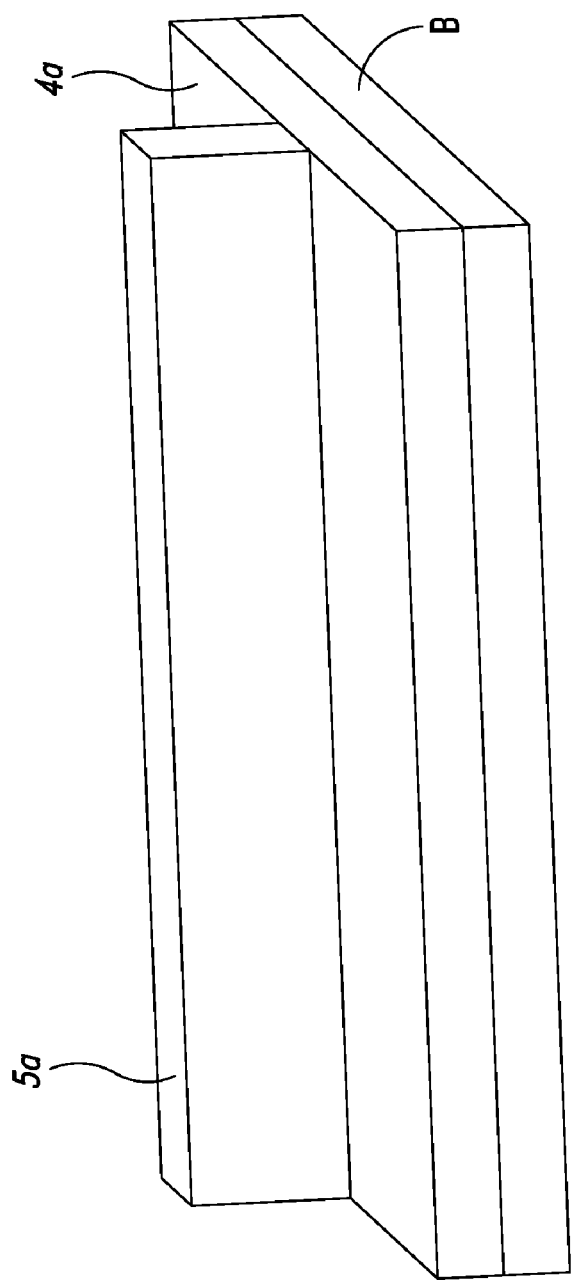
FIGS. 13a, 13b and 13c show some steps of a method according to the invention in order to obtain the architecture of FIG. 13.
Figure 13B:
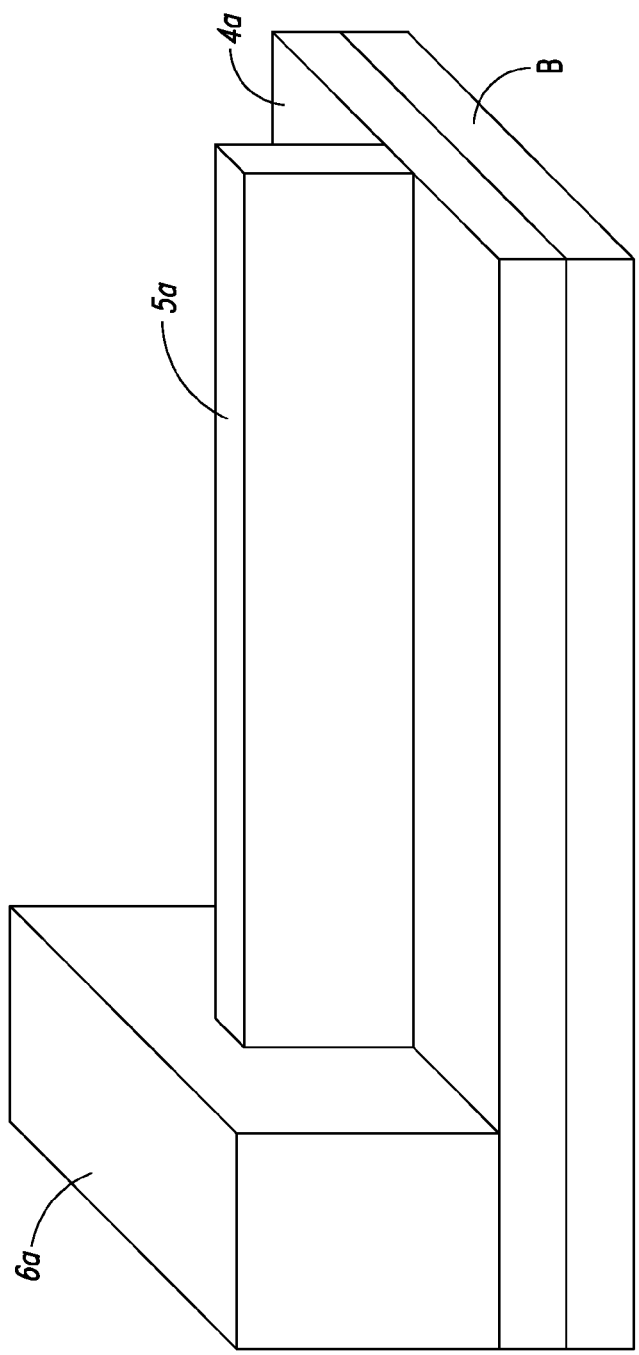
Figure 13C:
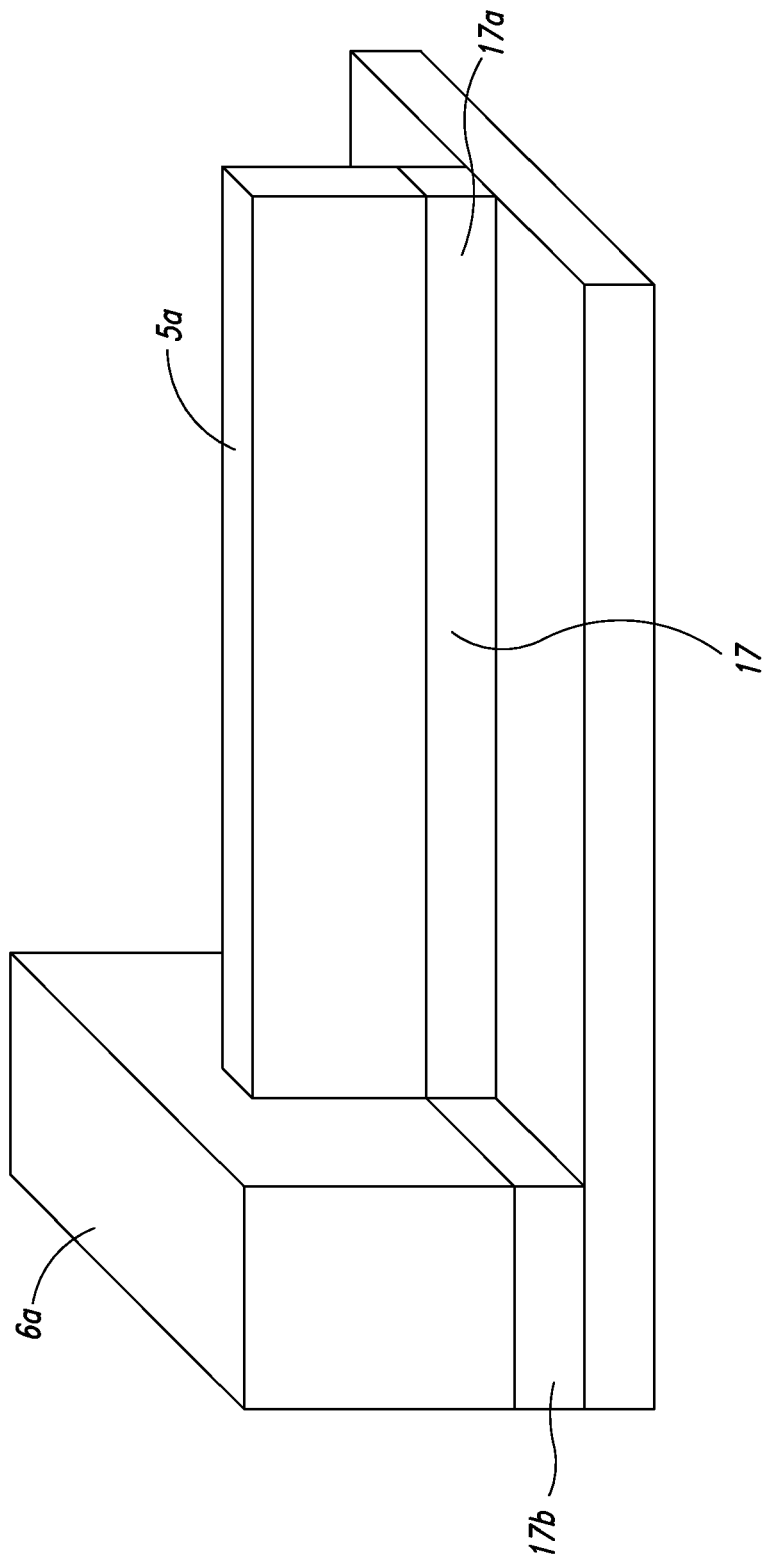

The realization of such a substantially T-shaped seed-spacer is now shown with reference to FIGS. 13a-13c wherein a seed-spacer indicated with 17 is obtained for example on a silicon substrate B.

A seed layer 4a having a predetermined nanometric height h, preferably an height comprised between 1 nm and 100 nm, is realized at first on the substrate B in order to obtain the seed-spacer 17, as shown in FIG. 13a.

The seed layer 4a is realized with a first predetermined material, for example by thermally growing a silicon oxide layer on the silicon substrate B.

Afterwards, through the MSPT, similarly to what has been previously described, a mask-spacer 5a is realized on the seed layer 4a. This mask-spacer 5a is realized with a second predetermined material, advantageously silicon nitride and it extends along a predetermined direction above the seed layer 4a, as it is always shown with reference to FIG. 13a.

A mask 6a is then realized, overlapping the mask-spacer 5a, extending in a substantially perpendicular direction thereto, as shown in FIG. 13b.

Advantageously, the mask 6a is realized through standard lithography, however it could be also obtained through the MSPT.

At this point a selective removal of the exposed seed layer 4a on the substrate B, i.e., a removal of the seed layer 4a portion not being protected by the mask-spacer 5a and by the mask 6a, realizes the substantially T-shaped seed-spacer 17, as shown in FIG. 13c.

In particular, the seed-spacer 17 comprises a linear portion 17a connected to a portion 17b being substantially orthogonal thereto.

The selective removal of the mask 6a and of the mask-spacer 5a leaves on the substrate B only the seed-spacer 17 which can be used to realize substantially L-shaped spacers 43, such as the ones shown in FIG. 13 and shown after selectively removing the seed-spacer 17.

The substantially L-shaped spacers 43 are realized by MSPT with a third predetermined material which can still be advantageously silicon nitride. It must also be noted that these spacers 43 have a height being at best equal to the height h of the seed layer 4a.

Figure 14:
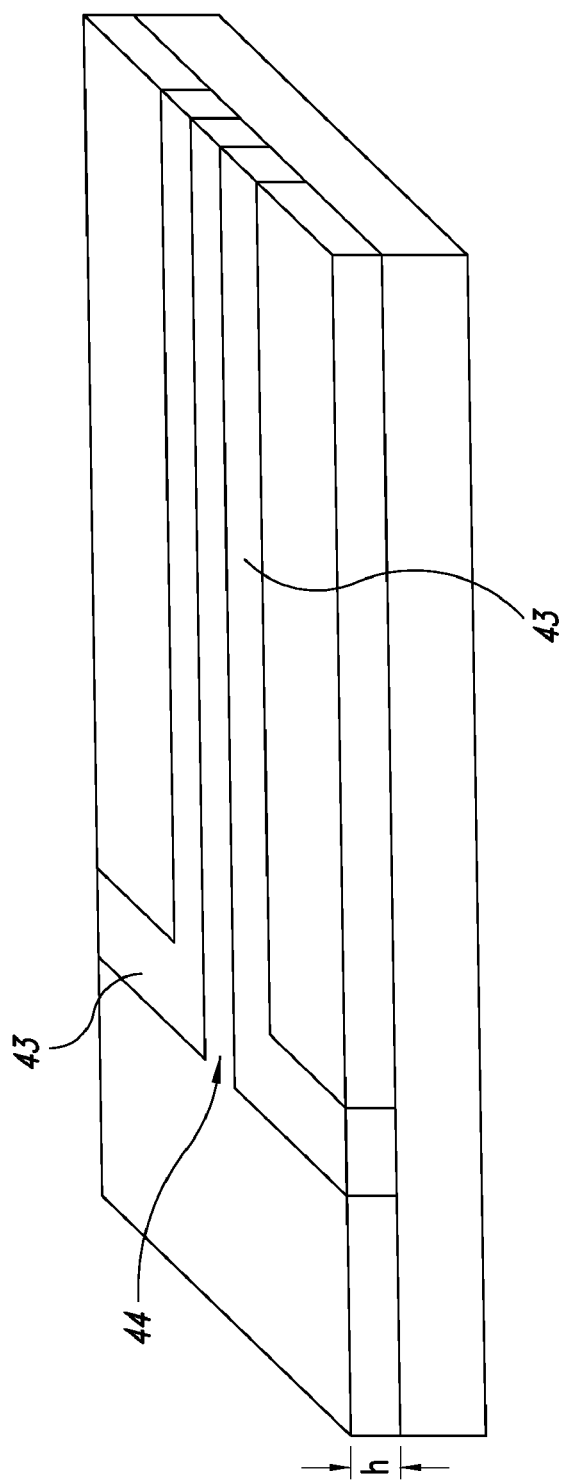

After said selective removal of the seed-spacer 17 a layer 44 of a forth material, for example an insulating layer, is then realized on the substrate B, as shown in FIG. 14. In a non-limiting way, this layer 44 is obtained for example by growing an oxide layer from the silicon substrate B, up to reach a suitable height corresponding at best to the height h of spacers 43.

Figure 15:
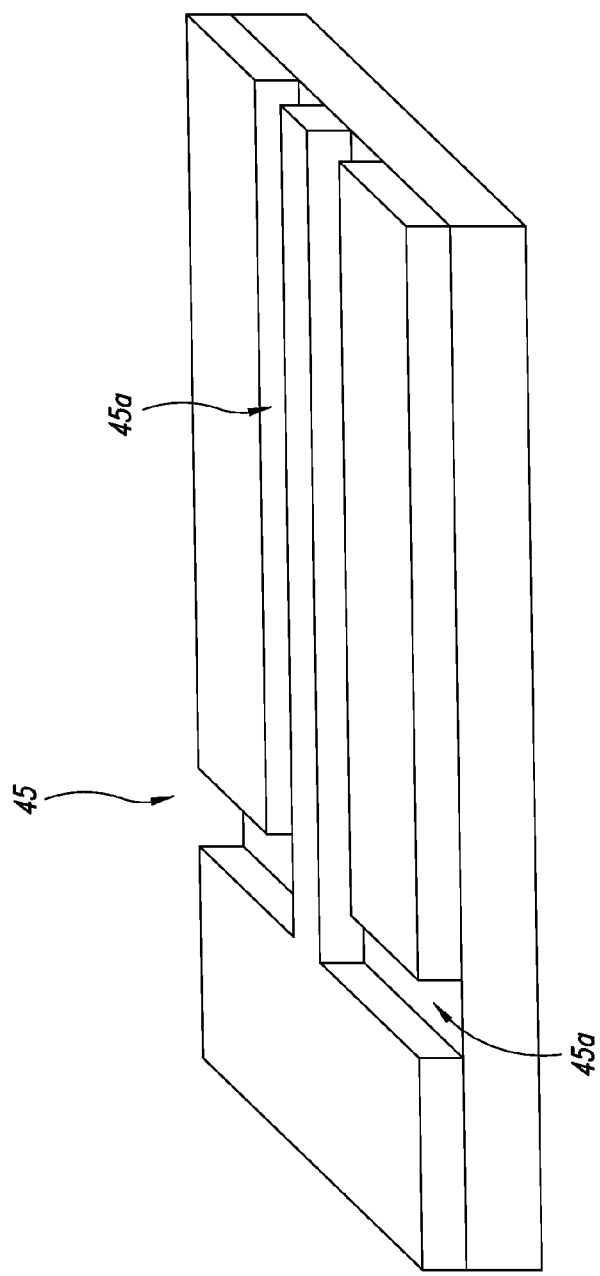

Finally, a selective removal of spacers 43 realizes said mold 45 which comprises substantially L-shaped recesses 45a substantially having the same nanometric size as spacers 43, as it is shown in FIG. 15.

As it will be better shown hereafter, the mold 45 can be advantageously used as a pattern to directly realize substantially L-shaped nanometric spacers on a semiconductor device substrate by using a Nano Imprint Lithography process (Nano Imprint Lithography—NIL).

In short, the NIL is a lithography process through which a predetermined topography of a pattern or mold defines by imprinting the topography or pattern on a substrate. The imprint is obtained by mechanically deforming a suitable resin used as a mask on the substrate.

It is thus possible to use the mold 45 to directly obtain substantially L-shaped nano-wires (or C-shaped when realizing a mold by using a substantially I-shaped seed-spacer) with no need to repeat the above-described series of steps.

To this purpose it is possible to point out the following.

First of all a mold 45 of the above-mentioned type is realized, i.e., a mold comprising L-shaped (or C-shaped) imprints realized, for example, with polysilicon.

Figure 16:
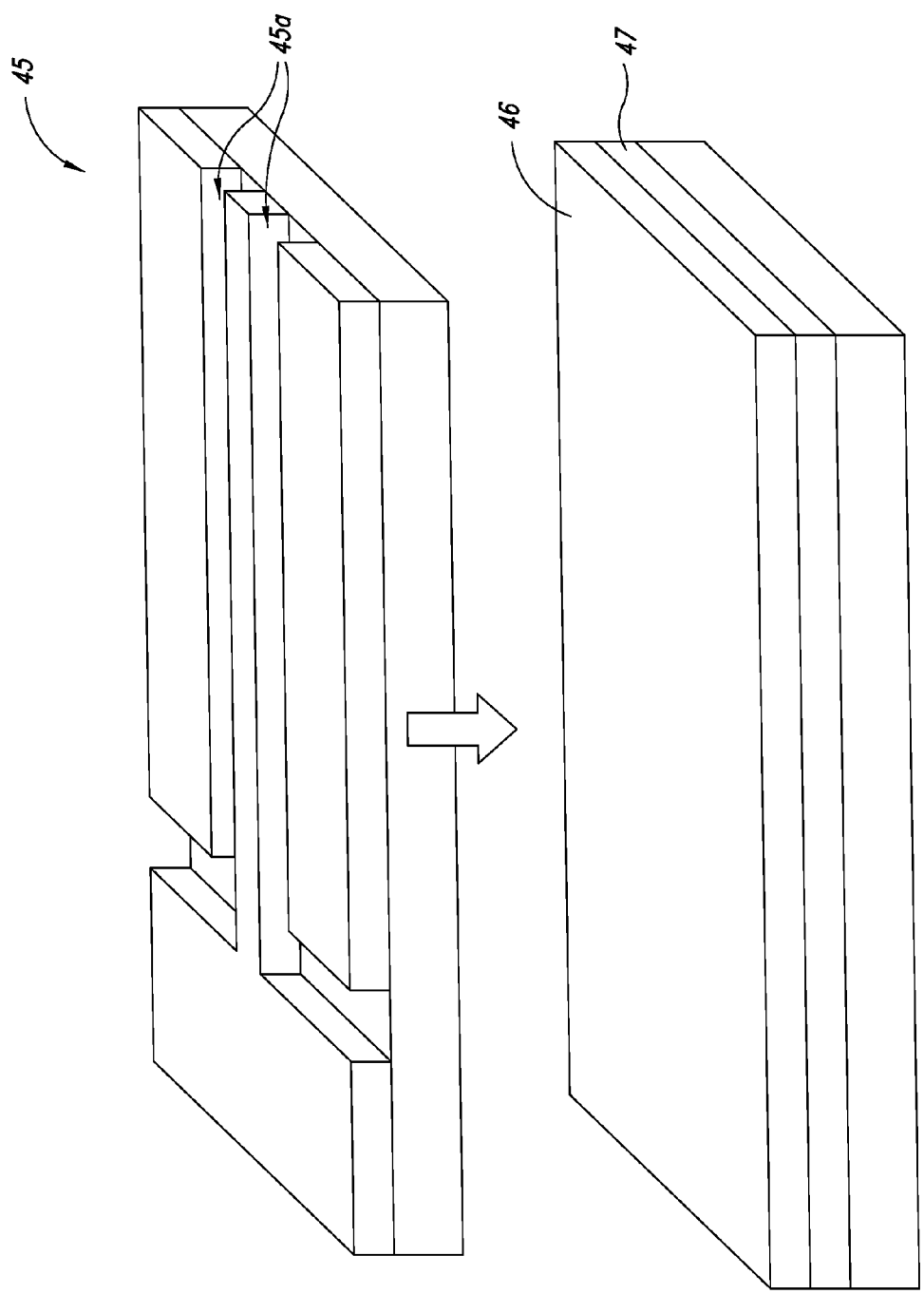
FIGS. 16 to 19 show some steps of a present method according to a further alternative embodiment of the invention.

Afterwards, the mold is imprinted on a resist layer 46 previously deposited in turn on a substrate 47, for example a polysilicon layer, as shown in FIG. 16. The imprint is traditionally transferred from the mold to the resist by means of the temperature and/or pressure and/or irradiation.

Figure 17:
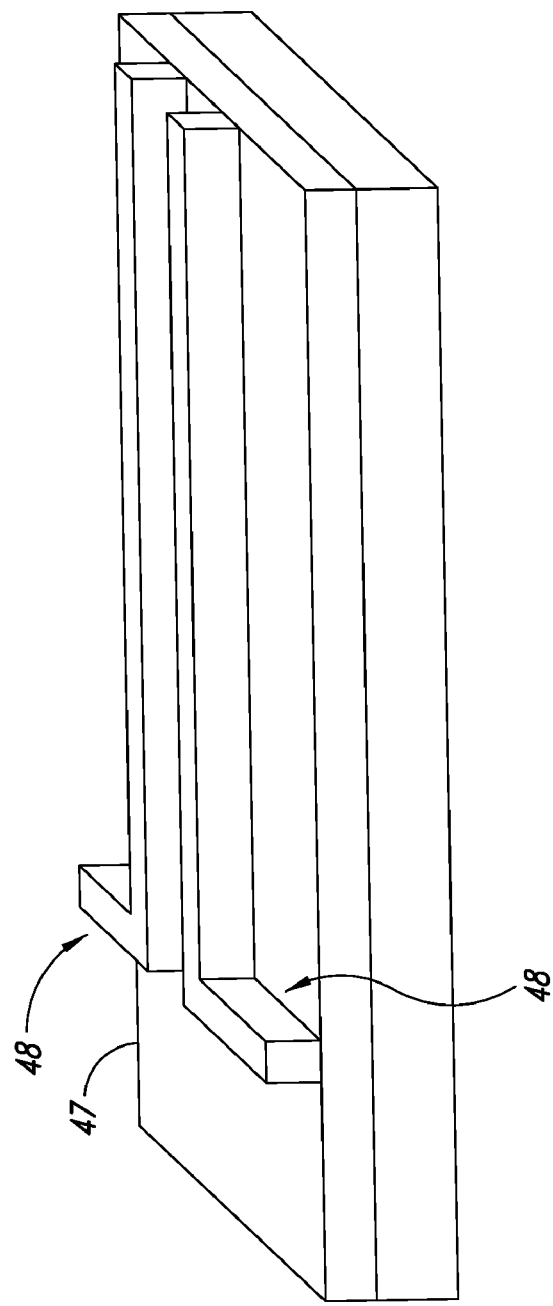

A following selective removal step by anisotropic etching removes the "imprinted" resist portion by leaving on the polysilicon substrate 47 a pair of resist spacers 48 having the same shape as the recesses 45a of the mold 45, i.e., a substantially L-shape, as shown in FIG. 17.

The resist layer 46 can be realized with any known resin suitable for use in an Imprint Lithography process.

Figure 18:
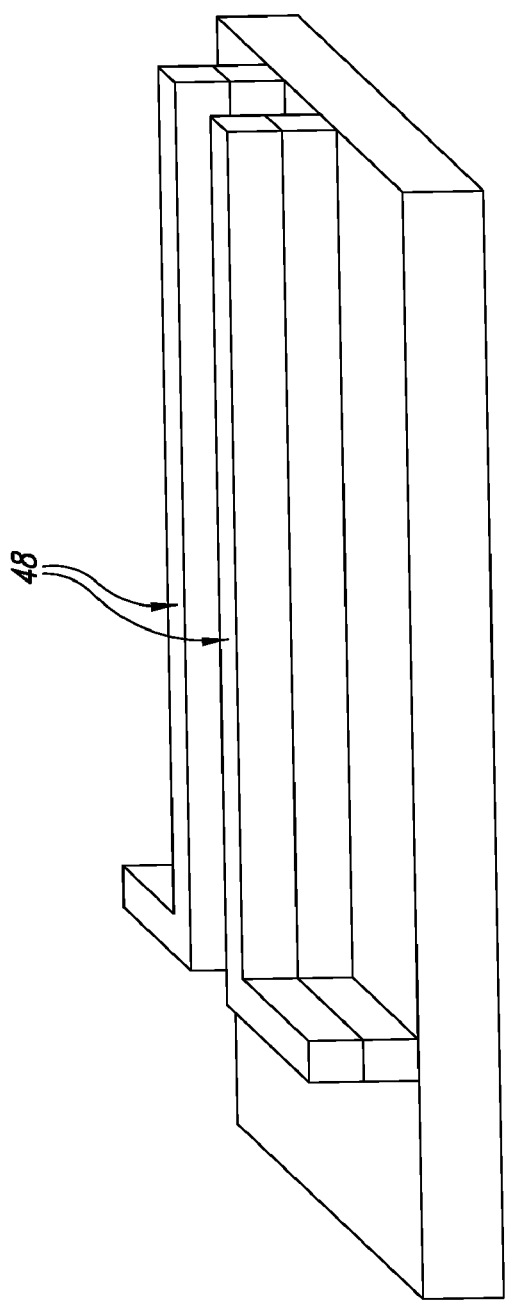
Figure 19:
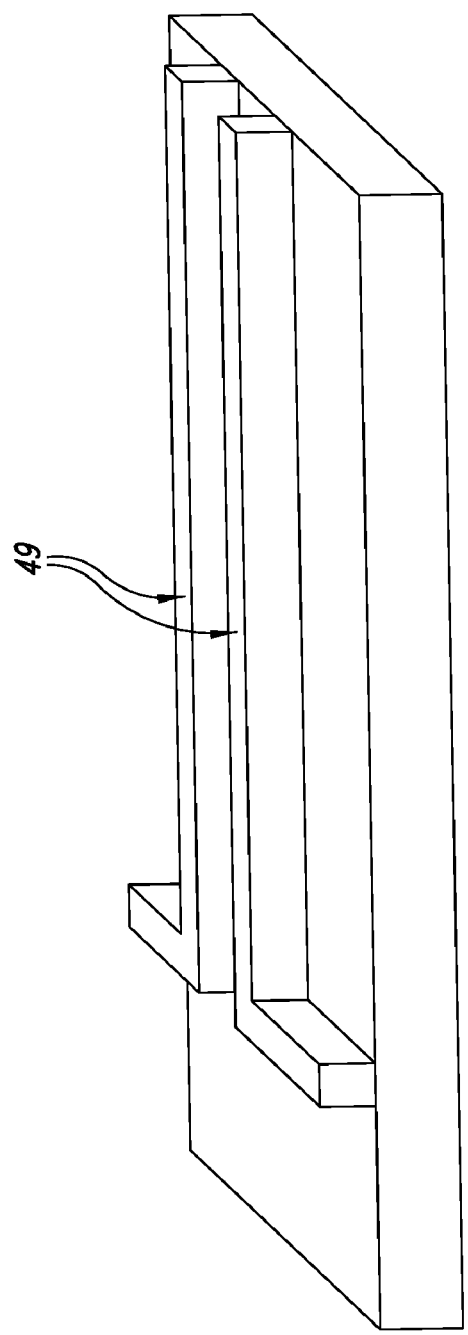

The resist spacers 48 act as a mask towards the underlying polysilicon substrate 47; then, after a selective etching towards the polysilicon, the latter is removed except for the protected portions being masked by the resist spacers 48, as shown in FIG. 18. A following removal of the resist spacers 48 realizes the desired structure, in the case being considered a pair of substantially L-shaped specularly identical nano-wires 49, advantageously made of polysilicon.

Suitably, crossbar architectures, like the above-described ones, can be realized by using a mold of the above-considered type.

Figure 20:
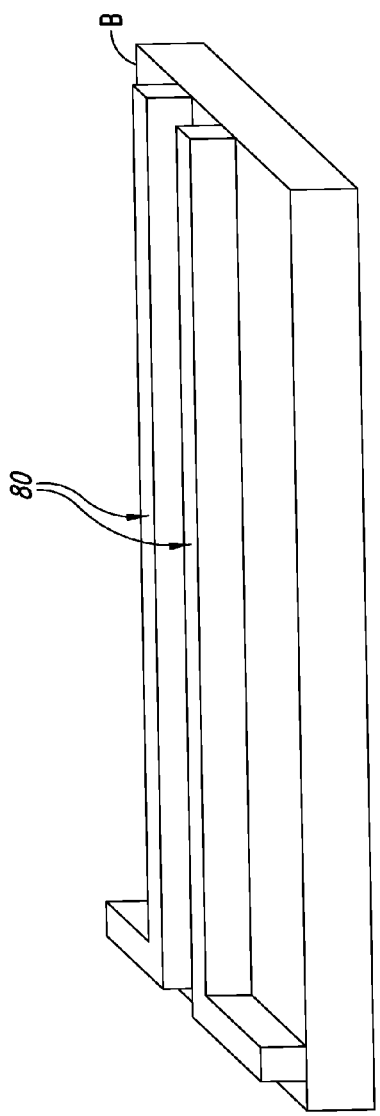
FIGS. 20 to 25 show some steps of a present method according to a further alternative embodiment of the invention.

Advantageously, a mold 45 can be used to realize pairs of substantially L-shaped (or C-shaped) polysilicon nano-wires on a first plane in order to obtain one or more lower architectures, as it is shown in FIG. 20 limitedly to a pair of substantially L-shaped nano-wires, realized on a substrate B and indicated with 80.

Figure 21:
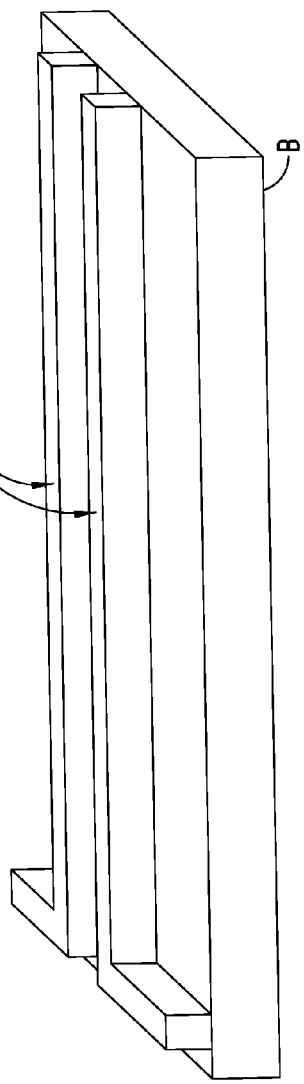

Then, a polysilicon thermal oxidation step leads to an oxide layer being formed obtaining oxidized nano-wires 81 as shown in FIG. 21. Advantageously, this oxide layer can have a size being adjusted (tuned) on the size of a molecular device.

Figure 22:
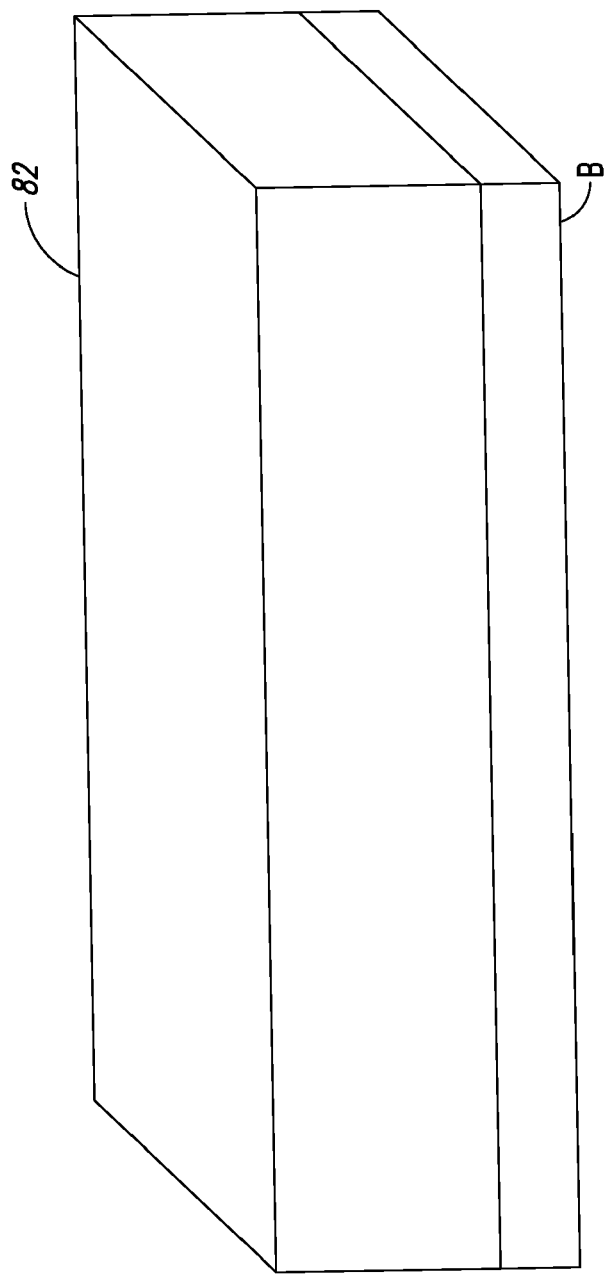

A following deposition step of a polysilicon layer 82 on the oxidized nano-wires 81 of the lower architecture is shown in FIG. 22. This deposition step can be followed in case by a planarization step of the deposited polysilicon layer 82, and in case again by an oxidation step in order to obtain a predetermined constant height of the polysilicon layer 82.

Figure 23:
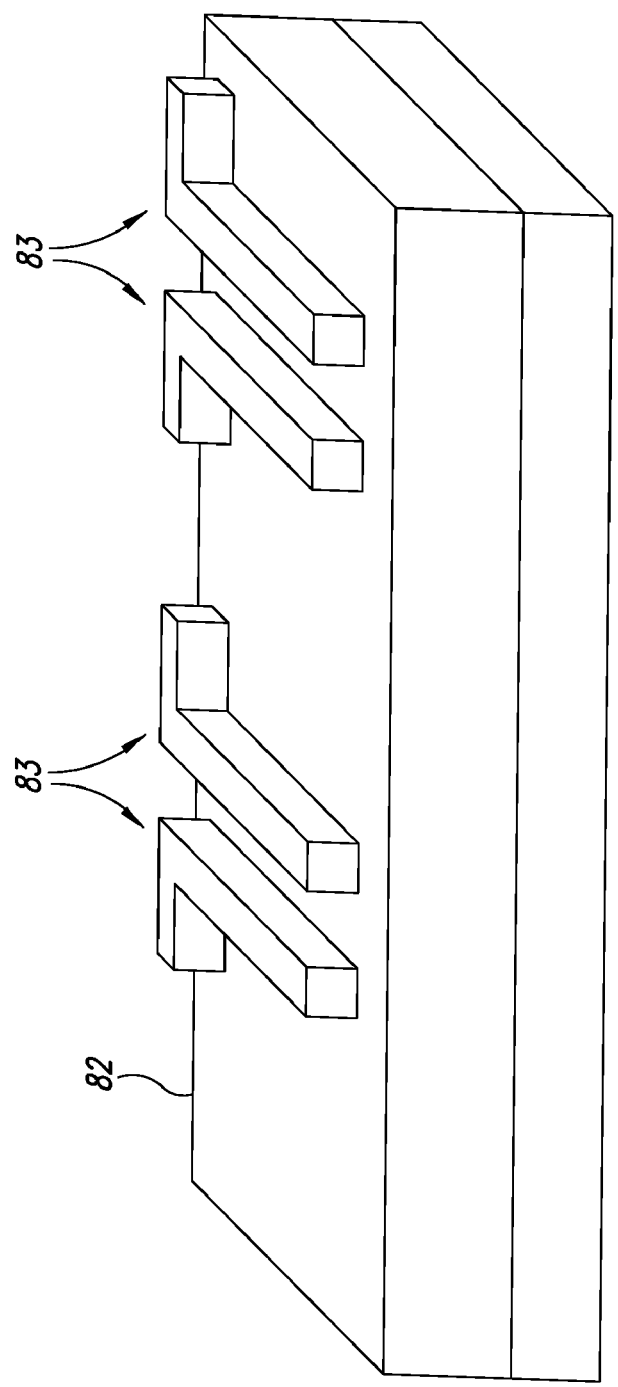

Then, through the NIL and the use of the same mold 45, pairs of substantially L-shaped resist nano-wires 83 are realized on the polysilicon layer 82, arranged along a direction being substantially orthogonal to the oxidized nano-wires 81 of the lower architecture, as shown in FIG. 23.

Figure 24:
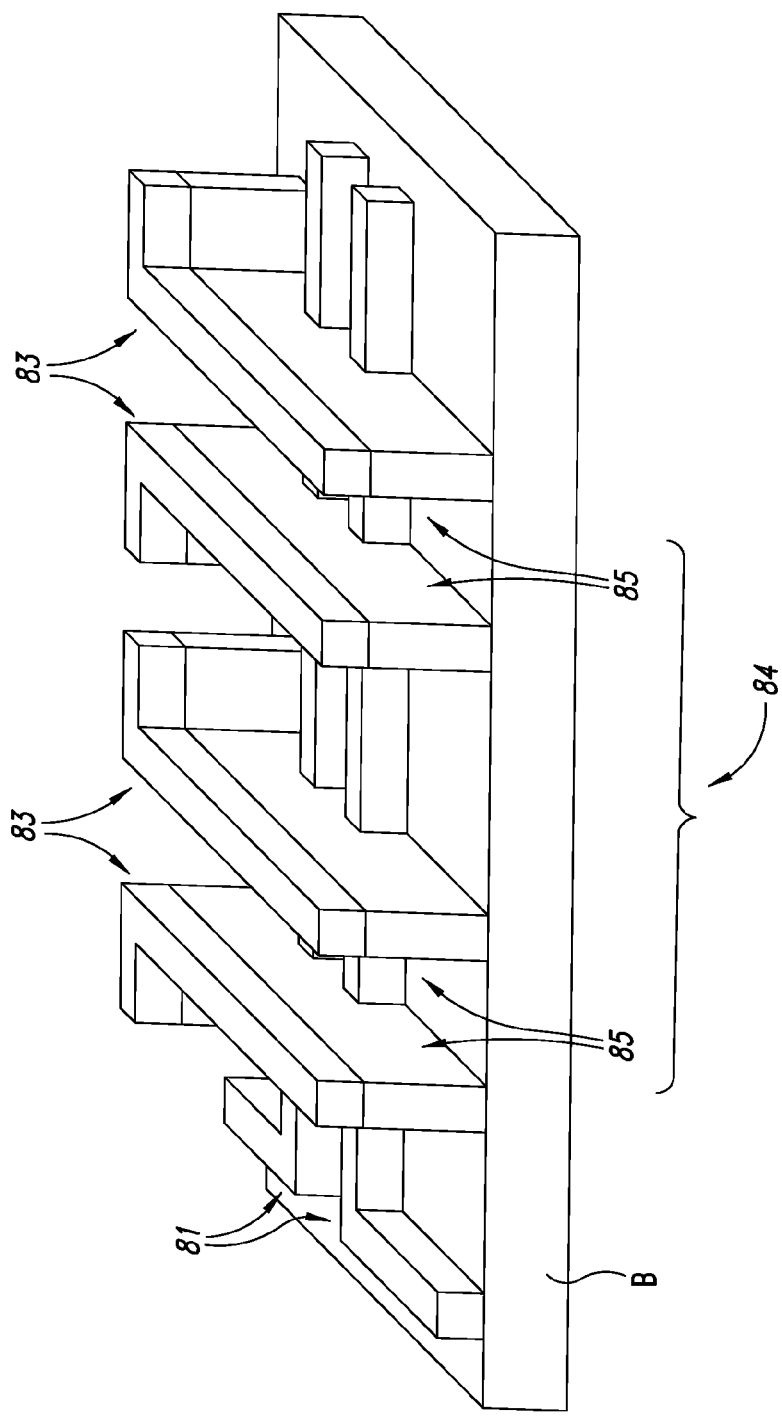

At this point, a removal step performed through a polysilicon selective etching further transfers the mold, i.e., templates of substantially L-shaped nano-wires, on the underlying polysilicon layer 82, as shown in FIG. 24.

Therefore an upper architecture 84 is obtained on a second plane, comprising a plurality of pairs of substantially L-shaped specularly identical polysilicon nano-wires 85 crossing the pairs of nano-wires of the lower architecture.

Figure 25:
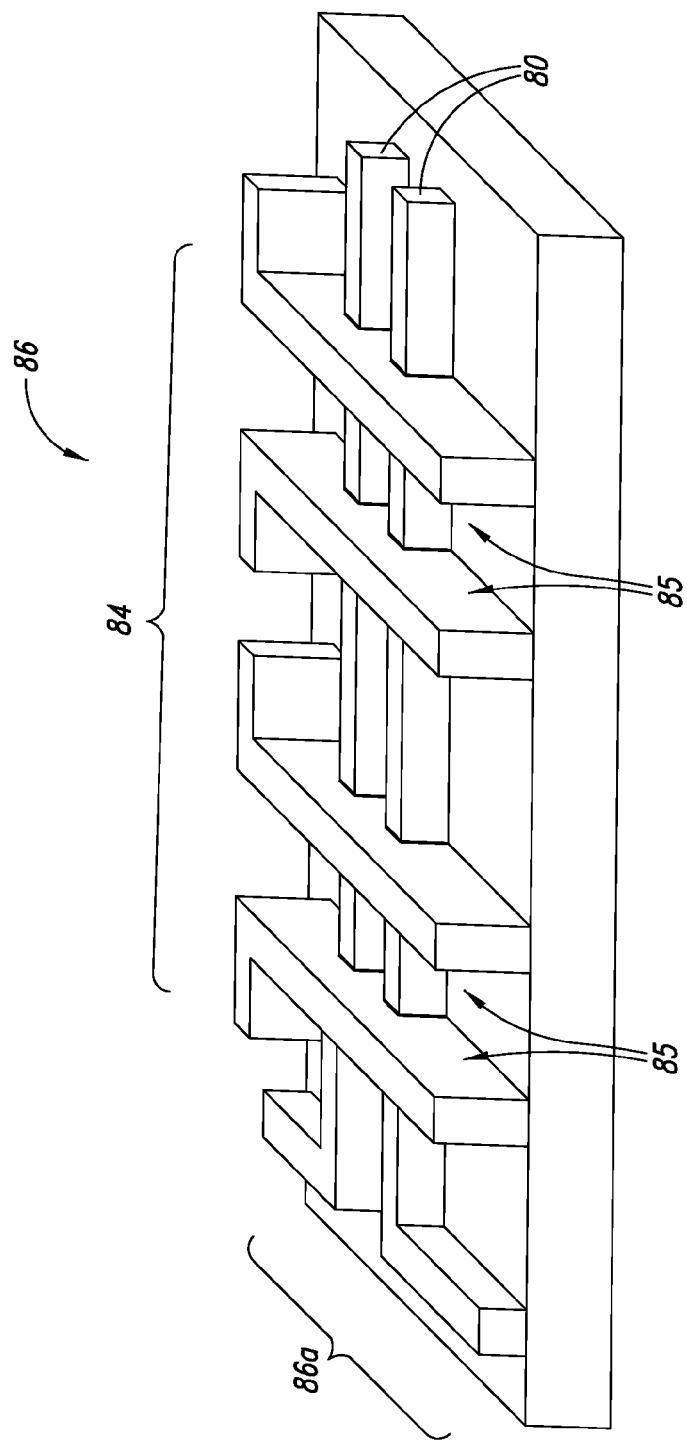

Finally, after removing the resist 83, and after a selective etching step of the thermal oxide layer previously grown on the polysilicon nano-wires 80, a crossbar architecture is obtained, globally indicated with 86 and shown in FIG. 25.

In particular, the crossbar architecture 86 comprises a lower architecture 86a comprising a pair of substantially L-shaped specularly identical conductive nano-wires 80, which are crossed by two pairs of substantially L-shaped specularly identical nano-wires 85 of the upper architecture 84.

The main advantage of a method according to the invention is represented by the fact of obtaining a nanometric circuit architecture being directly suitable for addressing by a standard electronic device.

In particular, a method according to the invention allows an architecture of said type to be realized with an extreme precision and control of the architecture size.

Still advantageously, a method according to the invention is particularly economical and easy to realize, besides fast to implement, providing steps being easily integrable in the productive processes presently used to realize semiconductor electronic devices.

Moreover, both if the circuit architecture is fully realized through the MSPT, and if it or portions thereof are realized by using the NIL, a method according to the invention is particularly indicated for use in industrial applications for a large-scale production of integrated circuits comprising such an architecture.

In substance, through the present invention it is possible to realize a nanometric circuit architecture, or more nanometric architectures gathered in a region of an integrated circuit indicated as nanometric, which can be directly addressed by a standard electronics, i.e., by that directly accessible circuit portion which is usually identified as micrometric region.

Obviously, in order to meet contingent and specific requirements, a skilled in the art could bring to the above-described invention several changes, all however comprised in the scope of protection of the invention, as defined by the following claims.

The invention claimed is:

1. A method for forming a nanometric circuit architecture in a semiconductor device, the method comprising:
   forming a plurality of active areas on a substrate of said semiconductor device;
   forming on said substrate a seed layer of a first material;
   forming a mask-spacer of a second material on said seed layer in a region comprised between said active areas, said mask-spacer being realized by a spacer patterning technique and having an end portion extending beyond said region;

forming a mask overlapping said mask-spacer and extending in a transverse direction to said mask-spacer;
obtaining a seed-spacer by selectively removing exposed portions of the seed layer that are not covered by the mask-spacer and mask, the seed-spacer comprising a linear portion extending in said region and a portion transverse to the linear portion;
removing said mask and said mask-spacer; and
forming at least one nano-wire of conductive material based on said seed-spacer by a spacer patterning technique, said at least one nano-wire comprising a first portion at least partially extending in said region and a second portion in contact with one of the active areas, said second portion being transverse to said first portion.

2. A method according to claim 1, wherein forming said mask-spacer on said seed layer comprises:
depositing a seed-block on a peripheral portion of the substrate;
defining a sacrificial spacer from said seed-block by depositing a sacrificial layer and anisotropically etching said sacrificial layer, said sacrificial spacer extending to partially cover said region of the substrate;
defining the mask-spacer from said sacrificial spacer by depositing a layer and anisotropically etching of said deposited layer;
removing said seed-block and said sacrificial spacer.

3. A method according to claim 1 wherein said mask is a resist mask realized by defining a resist layer by lithography.

4. A method according to claim 1, wherein forming the at least one nano-wire of conductive material based on said seed-spacer includes forming an insulating spacer from said seed-spacer by a spacer patterning technique, said insulating spacer reproducing at least part of a profile of said seed-spacer, said insulating spacer being obtained from said seed-spacer by depositing an insulating material layer having a nanometric thickness followed by anisotropically etching of said insulating material layer.

5. A method according to claim 1 wherein said portions of said seed-spacer substantially define a T, said at least one nano-wire including two specularly identical nano-wires each with a substantially L-shaped profile.

6. A method according to claim 5 wherein said nano-wires comprise respective first portions parallel to each other and at least partially extending in the region of substrate comprised between the active areas, and respective second portions substantially orthogonal to the first portions and in contact with the active areas, respectively.

7. A method according to claim 1 wherein said seed-spacer comprises said linear portion connected to two opposed portions substantially orthogonal to the linear portion, the seed-spacer substantially defining an I, and said at least one nano-wire includes two specularly identical nano-wires each with a substantially C-shaped profile.

8. A method according to claim 7 wherein said two specularly identical nano-wires comprise respective first portions parallel to each other and at least partially extending in the region of substrate comprised between the active regions, and respective two opposed second portions being substantially orthogonal to the first portions, and in contact with the active areas, respectively.

9. A method according to claim 7, further comprising:
depositing respective seed-blocks on said two opposed portions of the seed-spacer;
defining by a spacer patterning technique two covering spacers extending respectively from the seed-blocks to partially cover said region of substrate comprised between active areas, the covering spacers forming a window between said covering spacers;
obtaining a nanometric circuit architecture comprising four substantially L-shaped nano-wires in specularly identical pairs of nano-wires, by oxidizing parts of said two specularly identical nano-wires that are exposed in said window, forming an insulating strip extending crosswise between the pairs of nano-wires; and
removing said two covering spacers and said two seed-blocks.

10. A method for forming a nanometric circuit architecture in a semiconductor device, the method, comprising:
forming a nanometric crossbar circuit architecture in a semiconductor device by steps including:
forming on a substrate between active regions a lower architecture that includes at least one pair of specularly identical nano-wires;
forming on said lower architecture a protective first layer having a nanometric thickness;
forming on said first layer a covering layer, and planarizing said covering layer;
forming a second layer having a nanometric thickness;
forming by a spacer patterning technique a mask-spacer on said second layer crosswise to said at least one pair of specularly identical nano-wires of said lower architecture;
forming a mask overlapping an end portion of said mask-spacer and extending in a transverse direction thereto;
selectively removing portions of said second layer not protected by said mask-spacer and by said mask;
removing said mask and said mask-spacer obtaining at least one seed-spacer;
forming by a spacer patterning technique from said seed-spacer a pair of specularly identical covering spacers positioned crosswise to said at least one pair of specularly identical nano-wires of said lower architecture;
removing said seed-spacer;
obtaining an upper architecture comprising a pair of nano-wires substantially having the same size as said pair of covering spacers and arranged crosswise to said at least one pair of specularly identical nano-wires of said lower architecture, by selectively removing portions of said covering layer not masked by the covering spacers;
removing said pair of covering spacers;
removing said first protective layer.

11. A method according to claim 10 wherein the nano-wires of said at least one pair of specularly identical nano-wires of said lower architecture or the nano-wires of said upper architecture are substantially L-or-C-shaped.

12. A method for forming a nanometric circuit architecture in a semiconductor device, the method, comprising:
forming on a substrate a mold comprising at least one nanometric recess, including:
forming on the substrate a seed layer of a nanometric height of a first material;
forming on said seed layer by a spacer patterning technique a mask-spacer of a second material extending along a first direction;
forming a mask overlapping said mask-spacer and extending in a second direction transverse to the first direction;
obtaining a seed-spacer by selectively removing exposed portions of said seed layer not covered by the mask-spacer and mask, the seed-spacer comprising a linear portion connected to a portion transverse to the linear portion;
removing said mask and said mask-spacer;

forming at least one spacer from said seed-spacer through a spacer patterning technique, said spacer being formed with a third material and having a height corresponding to the height of said seed layer and a nanometric thickness;

removing said seed-spacer;

forming a layer of a fourth material; and removing said at least one spacer, wherein said at least one nanometric recess has a size substantially equal to said spacer.

13. A method according to claim 12 wherein the portions of said seed-spacer substantially defining a T, and said at least one spacer includes two specularly identical spacers each with a substantially L-shaped profile.

14. A method according to claim 12 wherein said seed-spacer comprises said linear portion and two opposed portions substantially orthogonal to the linear portion and substantially defining a I, and said at least one spacer includes two specularly identical spacers with a substantially C-shaped profile.

15. A method according to claim 12, wherein said at least one mask is formed by defining a resist layer by standard lithography.

* * * * *